(12) United States Patent
Sugiyama et al.

(10) Patent No.: US 12,074,410 B2
(45) Date of Patent: Aug. 27, 2024

(54) LIGHT-EMITTING ELEMENT AND LIGHT-EMITTING DEVICE

(71) Applicant: HAMAMATSU PHOTONICS K.K., Hamamatsu (JP)

(72) Inventors: Takahiro Sugiyama, Hamamatsu (JP); Akiyoshi Watanabe, Hamamatsu (JP); Hiroki Miyachi, Hamamatsu (JP); Ryoichi Kashiro, Hamamatsu (JP); Takeshi Kanzaki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 677 days.

(21) Appl. No.: 17/287,149

(22) PCT Filed: Oct. 23, 2019

(86) PCT No.: PCT/JP2019/041568
§ 371 (c)(1),
(2) Date: Apr. 21, 2021

(87) PCT Pub. No.: WO2020/085397
PCT Pub. Date: Apr. 30, 2020

(65) Prior Publication Data
US 2021/0391691 A1    Dec. 16, 2021

(30) Foreign Application Priority Data
Oct. 25, 2018  (JP) .................... 2018-201039

(51) Int. Cl.
*H01S 5/11*  (2021.01)
*H01S 5/02*  (2006.01)
*H01S 5/32*  (2006.01)

(52) U.S. Cl.
CPC .............. *H01S 5/11* (2021.01); *H01S 5/0216* (2013.01); *H01S 5/3211* (2013.01)

(58) Field of Classification Search
CPC ........ H01S 5/11; H01S 5/0216; H01S 5/3211; H01S 5/0234; H01S 5/0237;
(Continued)

(56) References Cited

U.S. PATENT DOCUMENTS 7,731,430 B2 * 6/2010 Ohtsu .................. G02B 6/4214
                                                385/94
8,155,163 B2 * 4/2012 Saito ........................ H01S 5/18
                                                372/50.1
(Continued)

FOREIGN PATENT DOCUMENTS

CN           101258652 A      9/2008
CN           104106184 A     10/2014
(Continued)

OTHER PUBLICATIONS

International Preliminary Report on Patentability mailed May 6, 2021 for PCT/JP2019/041568.

*Primary Examiner* — Vu A Vu
(74) *Attorney, Agent, or Firm* — Faegre Drinker Biddle & Reath LLP

(57) ABSTRACT

One aspect relates to a light-emitting element having a layer forming a resonance mode. The light-emitting element includes a structure body constituted by a substrate and a semiconductor laminate body including a first cladding layer, a second cladding layer, an active layer, and a resonance-mode forming layer including a basic layer and modified refractive index regions. A laser light output region and a metal electrode film are on opposing surfaces of the structure body. The metal electrode film includes a first layer forming ohmic contact with the structure body, a second layer reflecting light from the resonance-mode forming layer, a third layer, and a fourth layer for solder bonding. The third layer has a different composition from the second layer (Continued)

and the fourth layer, and has a lower diffusion degree than the second layer and the fourth layer to that of a solder material.

19 Claims, 21 Drawing Sheets

(58) Field of Classification Search
CPC ............. H01S 5/04253; H01S 5/04254; H01S 5/3432; H01S 5/04252; H01S 5/187
USPC ...................................................... 372/43.01
See application file for complete search history.

(56) References Cited

U.S. PATENT DOCUMENTS

| | | | |
|---|---|---|---|
| 8,829,638 B2* | 9/2014 | Shambat | H01S 5/3063 |
| | | | 257/656 |
| 9,660,415 B2* | 5/2017 | Takiguchi | H01S 5/187 |
| 9,793,436 B2* | 10/2017 | Chiu | H01L 33/02 |
| 9,948,060 B2* | 4/2018 | Takiguchi | H01S 5/026 |
| 10,938,177 B2* | 3/2021 | Noda | H01S 5/04256 |
| 2010/0303113 A1 | 12/2010 | Joseph | |
| 2013/0343415 A1* | 12/2013 | Hori | H01S 5/185 |
| | | | 372/38.05 |
| 2015/0034901 A1* | 2/2015 | Noda | H01S 5/185 |
| | | | 257/13 |
| 2016/0064894 A1* | 3/2016 | Takiguchi | G02F 1/13439 |
| | | | 372/26 |
| 2017/0012407 A1 | 1/2017 | Watanabe et al. | |
| 2017/0222399 A1* | 8/2017 | Hirose | H01S 5/0622 |

FOREIGN PATENT DOCUMENTS

| | | |
|---|---|---|
| CN | 105191029 A | 12/2015 |
| CN | 105960744 A | 9/2016 |
| CN | 108701965 A | 10/2018 |
| JP | 2010-093127 A | 4/2010 |
| JP | 2016-192527 A | 11/2016 |
| WO | WO-2013/118358 A1 | 8/2013 |
| WO | WO-2017/043122 A1 | 3/2017 |
| WO | WO-2017/150387 A1 | 9/2017 |
| WO | WO-2018/030523 A1 | 2/2018 |
| WO | WO-2018/047717 A1 | 3/2018 |

* cited by examiner

Fig.5
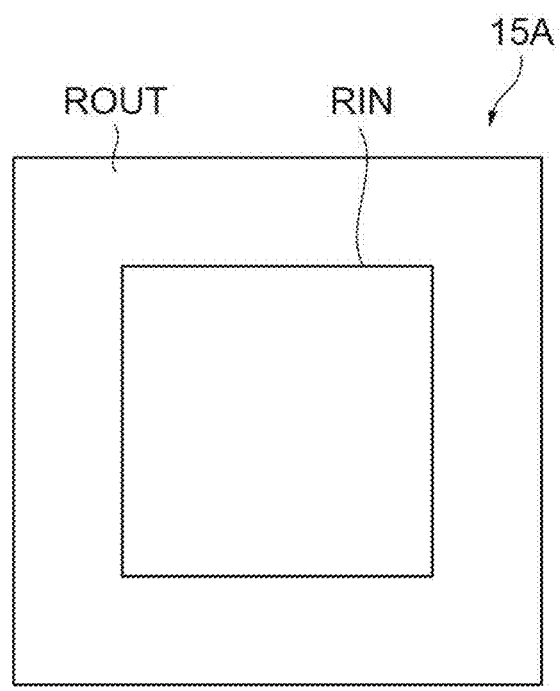
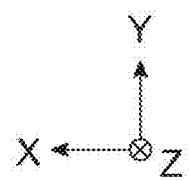

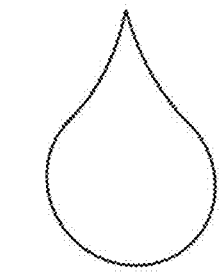
Fig.7A
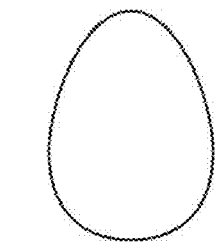
Fig.7B
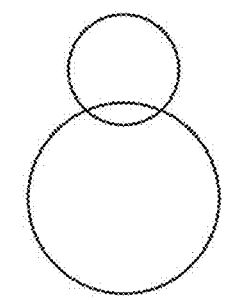
Fig.7C
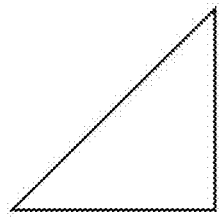
Fig.7D
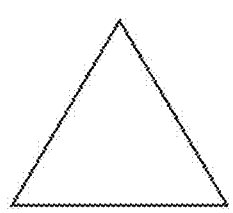
Fig.7E
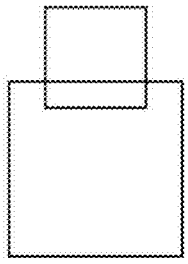
Fig.7F
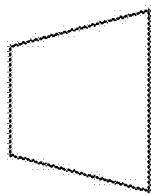
Fig.7G
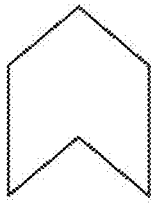
Fig.7H
Fig.7I
Fig.7J
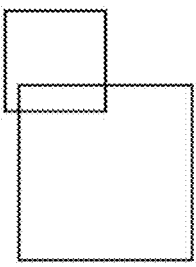
Fig.7K

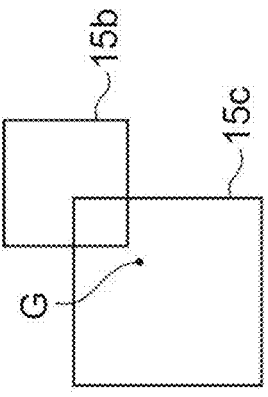
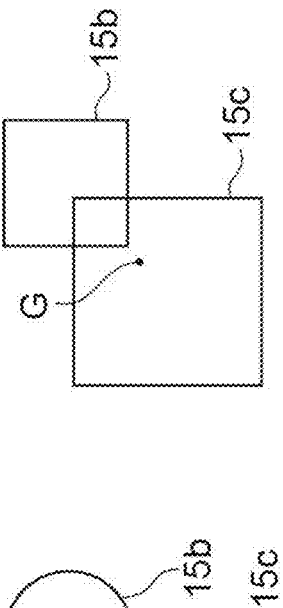
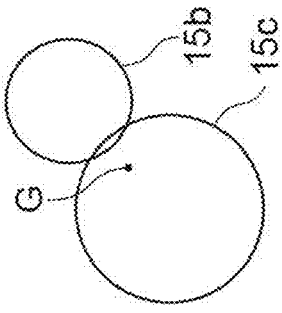
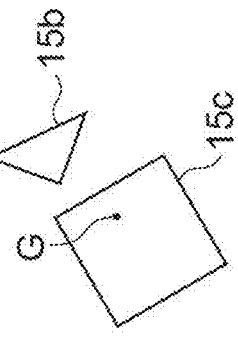
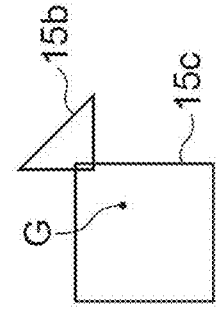
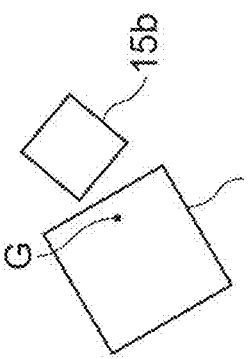
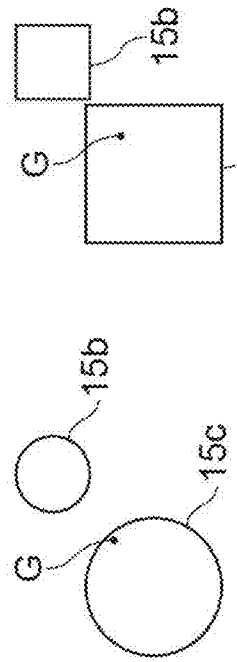
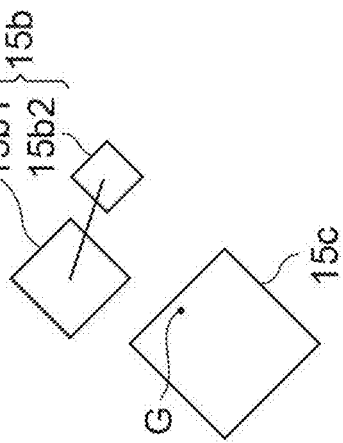
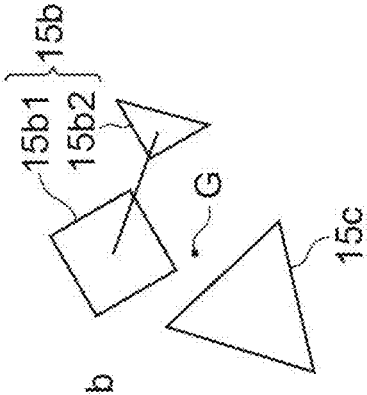
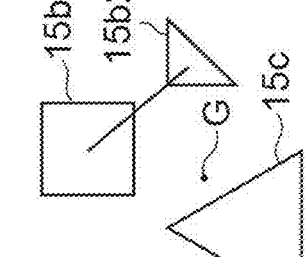
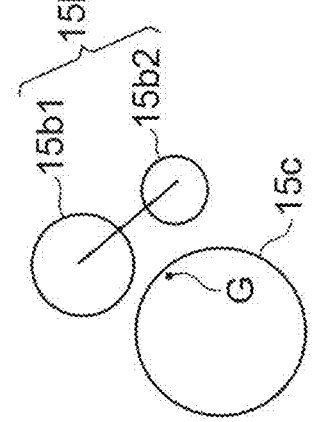

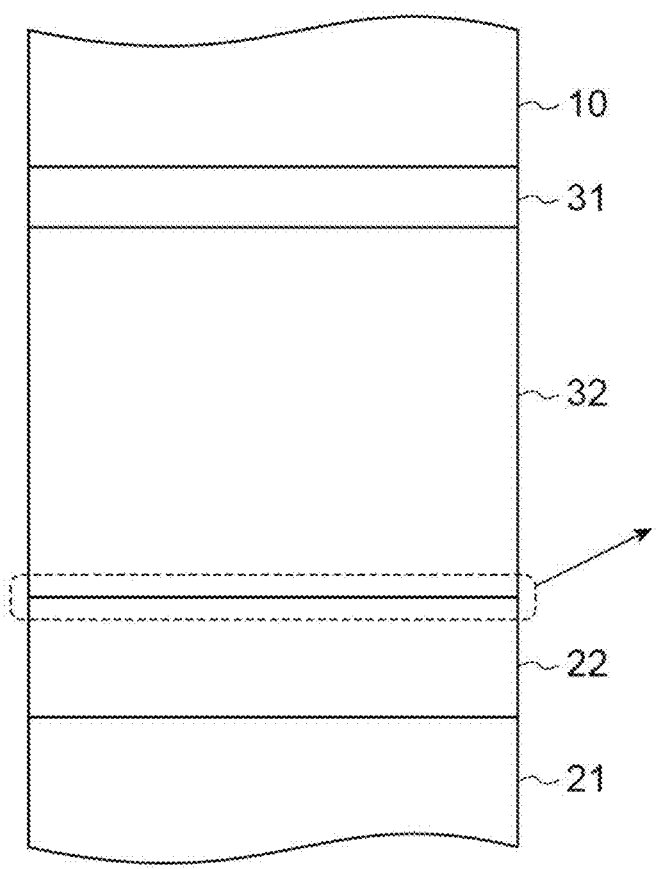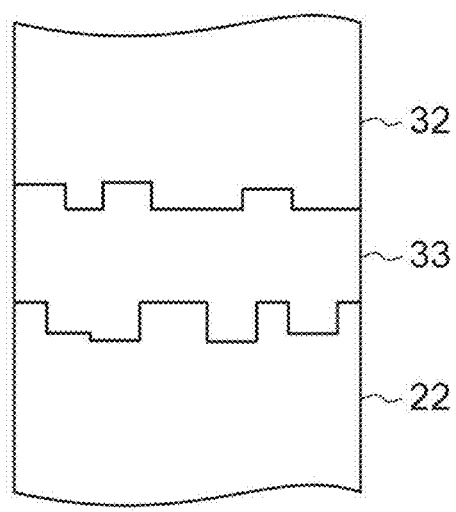

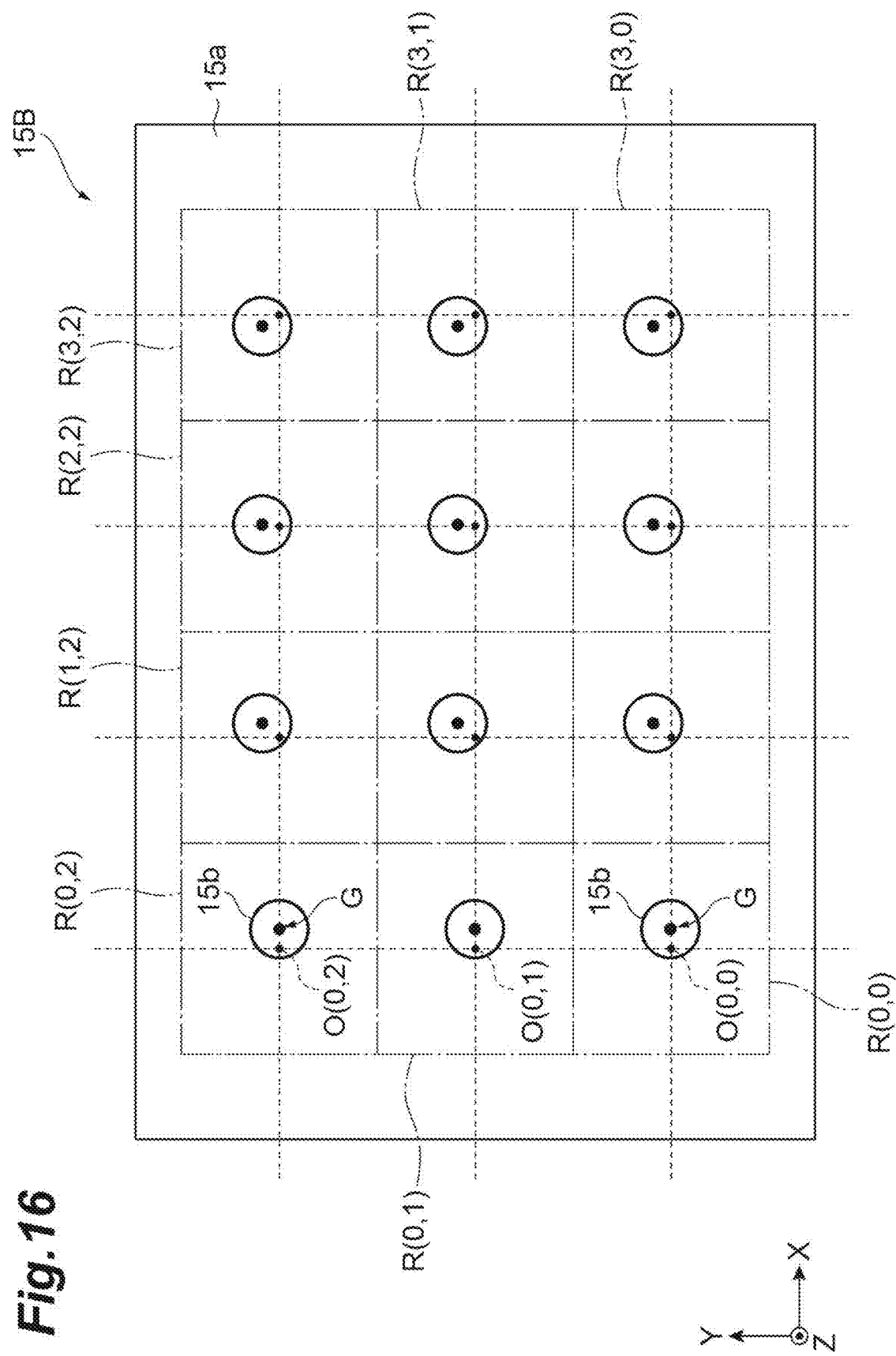

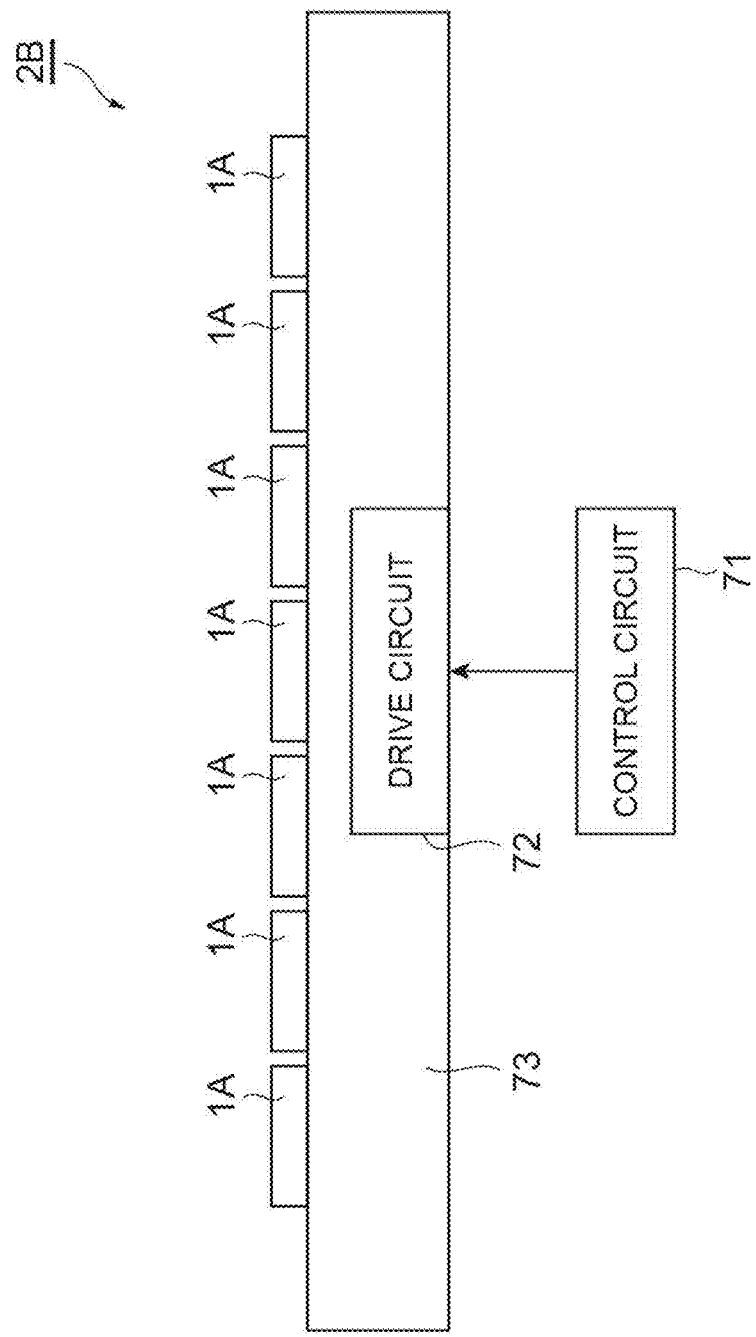

LIGHT-EMITTING ELEMENT AND LIGHT-EMITTING DEVICE

TECHNICAL FIELD

The present invention relates to a light-emitting element and a light-emitting device.

BACKGROUND ART

Patent Document 1 describes a technique relating to a surface light-emitting type semiconductor light-emitting device including a photonic crystal layer. In this semiconductor light-emitting device, a plurality of semiconductor light-emitting elements are arranged on a substrate. The semiconductor light-emitting element has a photonic crystal layer and an active layer arranged on a substrate, and an electrode formed on the photonic crystal layer and the active layer. The semiconductor light-emitting device further includes a submount. The submount means a structure in which electrodes of a plurality of semiconductor light-emitting elements are electrically connected on a substrate via solder.

CITATION LIST

Patent Literature

Patent Document 1: Japanese Patent Application Laid-Open No. 2010-93127

SUMMARY OF INVENTION

Technical Problem

As a result of studying the above-mentioned prior art, the present inventors have discovered the following problems. That is, in a surface light-emitting type light-emitting element that outputs laser light along a direction intersecting a main surface of a substrate, a layer (for example, a photonic crystal layer) forming a resonance mode in a direction along the main surface of the substrate may be provided near an active layer. In that case, part of the light outputted from the layer forming the resonance mode travels toward one surface of the light-emitting element, and is outputted from the one surface to the outside of the light-emitting element. The remaining part of the light outputted from the layer forming the resonance mode travels toward the other surface of the light-emitting element and is reflected by a metal electrode film provided on the other surface. After that, the reflected light travels toward the one surface and is outputted from the one surface to the outside of the light-emitting element. When the light-emitting element is of a so-called rear-face output type, the one surface (that is, the light exit surface) is a rear surface of the substrate. When the light-emitting element is of a so-called front-face output type, the one surface is a surface of a semiconductor laminate body (the surface opposite to the substrate) including the layer forming the resonance mode.

In the light-emitting element having the structure as described above, the metal electrode film provided on the other surface is configured to form ohmic contact with the semiconductor laminate body or the substrate. The metal electrode film may be electrically connected to a heat sink or the like via solder. Thus, the metal electrode film has a laminate structure of a lower layer (when a contact target is a p-type GaAs semiconductor, for example, a Ti layer, a Cr layer, or an Ni layer) for ohmic contact and an upper layer (for example, an Au layer) in contact with solder. When the lower layer is a Ti layer, a Pt layer may be provided between the lower layer and the upper layer.

However, the inventors have experimentally found that when a light-emitting element having the above structure is operated, light output decreases with time, or light output efficiency is low from an initial stage of energization. An object of the present invention is to suppress a decrease in light output in a surface light-emitting type light-emitting element including a layer forming a resonance mode.

Solution to Problem

In order to solve the above-mentioned problems, a light-emitting element according to one aspect of the present invention includes a substrate and a semiconductor laminate body that constitutes a structure body together with the substrate. The substrate has a main surface and a rear surface opposing the main surface. The semiconductor laminate body is provided on the main surface of the substrate and has a lower surface facing the main surface and an upper surface located on an opposite end side of the substrate with respect to the lower surface. Furthermore, the semiconductor laminate body includes a first cladding layer provided between the lower surface and the upper surface, a second cladding layer provided between the first cladding layer and the upper surface, an active layer provided between the first cladding layer and the second cladding layer, and a resonance-mode forming layer provided between the first cladding layer and the second cladding layer. Specifically, the resonance-mode forming layer is disposed between the first cladding layer and the active layer, or between the active layer and the second cladding layer. The resonance-mode forming layer includes a basic layer and a plurality of modified refractive index regions that each have a refractive index different from that of the basic layer and are distributed in a two-dimensional manner on a plane perpendicular to a stacking direction of the semiconductor laminate body. The structure body constituted by the substrate and the semiconductor laminate body has a first structural surface corresponding to the rear surface of the substrate and a second structural surface corresponding to the upper surface of the semiconductor laminate body. While a region for outputting laser light is provided on one of the first structural surface and the second structural surface of the structure body, on the other surface of the first structural surface and the second structural surface, a metal electrode film having a first layer surface facing the structure body and a second layer surface located on an opposite side to the structure body with respect to the first layer surface is provided.

The metal electrode film includes a first layer having the first layer surface, a second layer provided between the first layer and the second layer surface, a third layer provided between the second layer and the second layer surface, and a fourth layer for solder bonding provided between the third layer and the second layer surface. The first layer is in close contact with the structure body via the first layer surface so as to form ohmic contact with the structure body. The second layer has a composition different from that of the first layer, and reflects light from the resonance-mode forming layer. The third layer has a composition different from that of the second layer, and has a lower diffusion degree than the second layer with respect to a diffusion degree of a solder material. The fourth layer has a composition different from that of the third layer, and has a higher diffusion degree than the third layer with respect to the diffusion degree of the solder material.

Advantageous Effects of Invention

According to one aspect of the present invention, it is possible to suppress a decrease in light output in a surface light-emitting type light-emitting element and a light-emitting device including the layer forming the resonance mode.

BRIEF DESCRIPTION OF DRAWINGS

FIG. 5 is a plan view showing an example in which a modified refractive index region 15b is disposed only in a specific region of the photonic crystal layer.

FIGS. 7A to 7K are views showing examples of the planar shape of the modified refractive index region 15b.

FIGS. 8A to 8K are plan views showing other examples of the shape of the modified refractive index region in an X-Y plane.

FIG. 13A is a view schematically showing a state in which a lower layer 31 comprised of Cr and an upper layer 32 comprised of Au are stacked on a semiconductor laminate body 10 and a submount 21 and the upper layer 32 are bonded with a solder layer 22 interposed therebetween, and FIG. 13B is an enlarged view of an interface between the upper layer 32 and the solder layer 22.

FIG. 16 is a plan view of a phase modulation layer 15B included in an S-iPM laser.

FIG. 21 is a view showing a configuration of a light-emitting device 2B according to a third modification.

DESCRIPTION OF EMBODIMENTS

Figure 1:
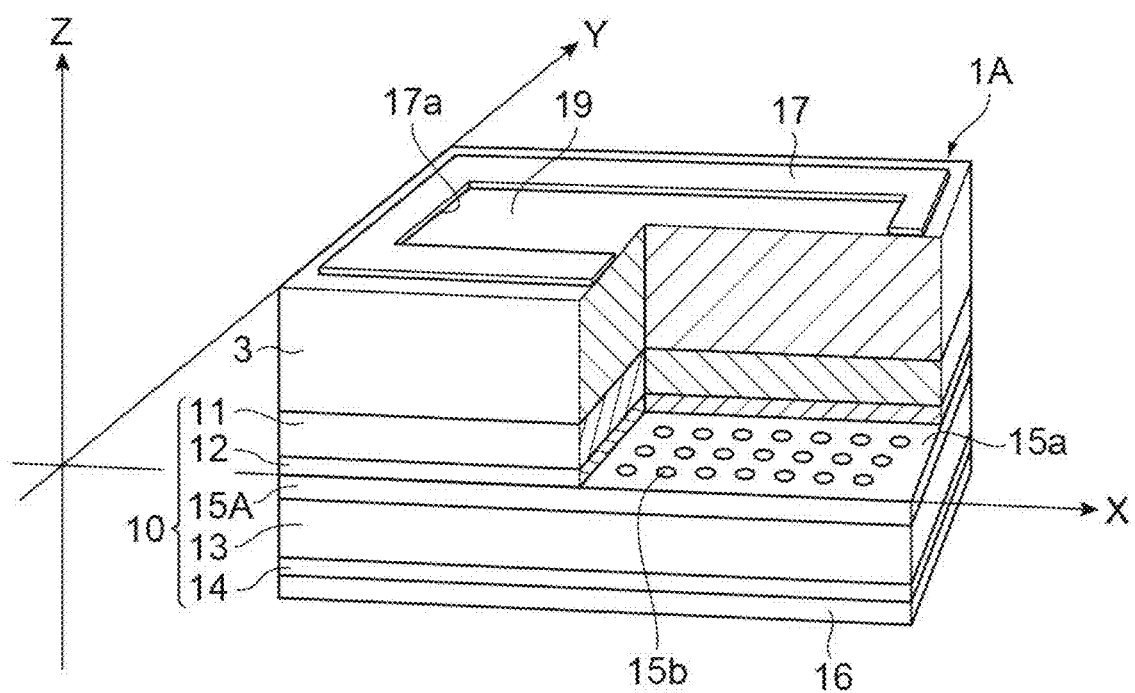
FIG. 1 is a perspective view showing a configuration of a surface light-emitting laser element 1A as a light-emitting element according to an embodiment of the present invention.

Description of Embodiment of the Present Invention

First, contents of embodiments of the present invention will be individually listed and described.

(1) As one aspect of the present embodiment, a light-emitting element according to the present embodiment includes a substrate and a semiconductor laminate body that constitutes a structure body together with the substrate. The substrate has a main surface and a rear surface opposing the main surface. The semiconductor laminate body is provided on the main surface of the substrate and has a lower surface facing the main surface and an upper surface located on an opposite end side of the substrate with respect to the lower surface. Furthermore, the semiconductor laminate body includes a first cladding layer provided between the lower surface and the upper surface, a second cladding layer provided between the first cladding layer and the upper surface, an active layer provided between the first cladding layer and the second cladding layer, and a resonance-mode forming layer provided between the first cladding layer and the second cladding layer. Specifically, the resonance-mode forming layer is disposed between the first cladding layer and the active layer, or between the active layer and the second cladding layer. The resonance-mode forming layer includes a basic layer and a plurality of modified refractive index regions that each have a refractive index different from that of the basic layer and are distributed in a two-dimensional manner on a plane perpendicular to a stacking direction of the semiconductor laminate body. The structure body constituted by the substrate and the semiconductor laminate body has a first structural surface corresponding to the rear surface of the substrate and a second structural surface corresponding to the upper surface of the semiconductor laminate body. While a region for outputting laser light is provided on one of the first structural surface and the second structural surface of the structure body, on the other surface of the first structural surface and the second structural surface, a metal electrode film having a first layer surface facing the structure body and a second layer surface located on an opposite side to the structure body with respect to the first layer surface is provided.

The metal electrode film includes a first layer having the first layer surface, a second layer provided between the first layer and the second layer surface, a third layer provided between the second layer and the second layer surface, and a fourth layer for solder bonding provided between the third layer and the second layer surface. The first layer is in close contact with the structure body via the first layer surface so as to form ohmic contact with the structure body. The second layer has a composition different from that of the first layer, and reflects light from the resonance-mode forming layer. The third layer has a composition different from that of the second layer, and has a lower diffusion degree than the second layer with respect to a diffusion degree of a solder material. The fourth layer has a composition different from that of the third layer, and has a higher diffusion degree than the third layer with respect to the diffusion degree of the solder material.

In the light-emitting element having the structure as described above, light outputted from the active layer reaches the resonance-mode forming layer while being confined between the first cladding layer and the second cladding layer. In the resonance-mode forming layer, a resonance mode is formed in a direction along the main surface of the substrate, and the laser light of the mode corresponding to arrangement of the plurality of modified refractive index regions is generated. The laser light travels in a direction intersecting the main surface of the substrate. In particular, the laser light traveling toward one surface is outputted from the one surface to the outside as it is. The laser light traveling toward the other surface is reflected by the metal electrode film, then travels toward one surface, and is outputted from the one surface to the outside.

The present inventors have obtained the following findings regarding the above-mentioned chronological decrease in light output. That is, when the light-emitting element operates, a temperature of the light-emitting element rises due to its heat generation. As the temperature rises, a constituent material of the solder gradually diffuses toward the lower layer while reacting with a constituent material of the upper layer. At this time, since the solder material diffuses non-uniformly, a diffusion portion grows non-uniformly, and a surface of the upper layer becomes uneven. A shape change in this upper layer causes a decrease in light reflectance and light scattering. Due to such a phenomenon, the light output of the light-emitting element is reduced. Thus, in a light-emitting element provided with a metal electrode film having a conventional structure, a chronological decrease in light output due to operation is unavoidable.

Thus, in the light-emitting element according to one aspect of the present embodiment, the metal electrode film has a multilayer structure including the first layer to the fourth layer. The first layer is in close contact with the semiconductor laminate body or the substrate constituting the structure body (ohmic contact). The second layer is provided on the first layer, has a composition different from that of the first layer, and reflects light from the resonance-mode forming layer. The fourth layer is provided on the second layer and is bonded to the solder when mounted as a portion of the light-emitting device on a submount. The third layer is provided between the second layer and the fourth layer, and has a composition different from the compositions of the second layer and the fourth layer. The diffusion degree of the solder material of the third layer is lower than that those of the second layer and the fourth layer. In this case, as the temperature of the light-emitting element rises, the constituent material of the solder gradually diffuses toward the second layer side while reacting with constituent materials of the fourth layer. However, the third layer in which the diffusion degree of the solder material is low exists between the second layer and the fourth layer. Therefore, the solder material is blocked in the third layer and is difficult to diffuse into the second layer. Thus, the second layer is less likely to be affected by the diffusion of the solder material, can suppress the decrease in light reflectance, and can reduce light scattering due to unevenness. From the above, according to the above-mentioned light-emitting element, it is possible to suppress the chronological decrease in light output due to operation.

(2) As one aspect of the present embodiment, the second layer may mainly contain at least one element of Au, Ag, Al, and Cu. With such a configuration, the light reflectance of the second layer can be increased.

(3) As one aspect of the present embodiment, the third layer may mainly contain at least one element of Pt, Ni, Ta, W, and Cr, or may contain TiN. This configuration can effectively block the diffusion of the solder material.

(4) As one aspect of the present embodiment, the fourth layer mainly contains at least one element of Au, Ag, Pt, Cu, Pd, Ni, and Al, and may be formed of a material different from the third layer. With this configuration, sufficient contact with the solder material is made, and stable electrical and physical contact with a submount material is possible.

(5) That is, as one aspect of the present embodiment, the metal electrode film includes a first layer having the first layer surface, a second layer provided between the first layer and the second layer surface, a third layer provided between the second layer and the second layer surface, and a fourth layer for solder bonding provided between the third layer and the second layer surface. The first layer is in close contact with the structure body via the first layer surface so as to form ohmic contact with the structure body. The second layer has a composition different from that of the first layer, and reflects light from the resonance-mode forming layer. The third layer has a composition different from that of the second layer, and has a lower diffusion degree than the second layer with respect to a diffusion degree of a solder material. The fourth layer has a composition different from that of the third layer, and has a higher diffusion degree than the third layer with respect to the diffusion degree of the solder material. In addition, the second layer mainly contains at least one element of Au, Ag, Al, and Cu. The third layer mainly contains at least one element of Pt, Ni, Ta, W, and Cr, or is formed of TiN. The fourth layer mainly contains at least one element of Au, Ag, Cu, Pd, and Al. According to the light-emitting element having such a structure, similarly to the above-mentioned light-emitting element, it is possible to suppress the chronological decrease in light output due to operation.

(6) As one aspect of the present embodiment, the first layer may contain at least one element of Ti, Cr, Mo, and Ni. With this configuration, ohmic contact between a p-type semiconductor layer or substrate and the first layer can be suitably realized.

(7) As one aspect of the present embodiment, a thickness of the third layer defined along a direction from the first layer surface toward the second layer surface may be thicker than a thickness of the first layer and thinner than a thickness of each of the second layer and the fourth layer. A material constituting the third layer may take longer to form a film than the materials constituting the second layer and the fourth layer. When the thickness of the third layer has increased up to a certain value or higher, the solder material is almost blocked, and a diffusion suppressing effect is hardly increased. Therefore, the third layer can be made thinner than the second layer and the fourth layer, and thus a time required for forming the metal electrode film can be shortened. Since a thickness of the first layer is sufficient as long as ohmic contact is made, the first layer may be thinner than the third layer.

(8) As one aspect of the present embodiment, the thickness of the first layer defined along the direction from the first layer surface toward the second layer surface is preferably 50 nm or less. In addition, the thickness of each of the second layer, the third layer, and the fourth layer is preferably 1000 nm or less. For example, when each layer has such a thickness, the effect of the metal electrode film according to one aspect of the present invention can be suitably exhibited.

(9) As one aspect of the present embodiment, the resonance-mode forming layer may be a photonic crystal layer in which a plurality of modified refractive index regions are periodically arranged along at least one direction on a set plane. The light outputted from the active layer reaches the photonic crystal layer while being confined between the first cladding layer and the second cladding layer. In the photonic crystal layer, a resonance mode is formed in the direction along the main surface of the substrate, and light oscillates at a wavelength corresponding to an arrangement period of the plurality of modified refractive index regions (generation of laser light). A part of the laser light is diffracted in a direction perpendicular to the main surface of the substrate and reaches one surface. The laser light may reach one surface directly, or may reach one surface after being reflected by the metal electrode film. The laser light that has reached one surface is outputted from the one surface to the outside of the light-emitting element. Therefore, the above-mentioned effect can be obtained even with such a configuration.

(10) As one aspect of the present embodiment, on the set plane, each of the plurality of modified refractive index regions is associated with any one of a plurality of lattice points of a virtual square lattice defined on the set plane (one or more modified refractive index regions are associated with one lattice point). In this state, for each lattice point of the virtual square lattice, a center of gravity of the modified refractive index region associated with the lattice point is disposed at a position away from the lattice point. Furthermore, for each lattice point of the virtual square lattice, a rotation angle of a line segment connecting the lattice point and the center of gravity of the associated modified refractive index region with respect to the virtual square lattice is set. In this case, the light outputted from the active layer reaches the resonance-mode forming layer while being confined between the first cladding layer and the second cladding layer. In the resonance-mode forming layer, the center of gravity of the plurality of modified refractive index regions has the rotation angle set for each modified refractive index region around the lattice point of the virtual square lattice. Such a light-emitting element outputs laser light (0th-order light) in the direction perpendicular to the main surface of the substrate. The 0th-order light reaches one surface directly, or reaches one surface after being reflected by the metal electrode film. The laser light that has reached one surface is outputted from the one surface to the outside of the light-emitting element. Therefore, the above-mentioned effect can be obtained even with such a configuration.

(11) As one aspect of the present embodiment, on the set plane, each of the plurality of modified refractive index regions is associated with any one of a plurality of lattice points of a virtual square lattice defined on the set plane (one or more modified refractive index regions are associated with one lattice point). In this state, for each lattice point of the virtual square lattice, the center of gravity of the modified refractive index region associated with the lattice point is disposed on a straight line that passes through the lattice point and is inclined with respect to the virtual square lattice. In addition, for each lattice point of the virtual square lattice, a distance from the lattice point to the associated modified refractive index region may be set. Also in a light-emitting element having such a structure, laser light (0th-order light) is outputted along the direction perpendicular to the main surface of the substrate. The 0th-order light reaches one surface directly, or reaches one surface after being reflected by the metal electrode film. The laser light that has reached one surface is outputted from the one surface to the outside of the light-emitting element. Therefore, the above-mentioned effect can be obtained even with such a configuration.

(12) The light-emitting device according to one aspect of the present embodiment may include a light-emitting element having the structure as described above and a submount having a mounting surface on which the light-emitting element is mounted. In this case, the metal electrode film of the light-emitting element and the mounting surface are bonded to each other via solder. The solder is preferably Sn solder, In solder, eutectic solder containing Sn, or lead-free solder containing Sn. In such a light-emitting device, as the temperature of the light-emitting element rises, a constituent material of the solder gradually diffuses inside the metal electrode film. However, since this light-emitting device includes any of the above light-emitting elements, the solder material is blocked in the third layer and is difficult to diffuse to the second layer. Thus, it is possible to suppress the chronological decrease in light output due to operation.

As described above, each of the aspects listed in the [Description of Embodiment of the Present Invention] is applicable to all the other aspects or all combinations of the other aspects.

Details of Embodiment of the Present Invention

Hereinafter, specific structures of the light-emitting element and the light-emitting device according to the present embodiment will be described in detail with reference to the accompanying drawings. The present invention is not limited to these exemplifications. The scope of the present invention is defined by the claims, and equivalence of and any modification within the scope of the claims are intended to be included therein. In the description of the drawings, the same elements will be denoted by the same reference symbols, and description thereof will not be repeated.

Figure 2:
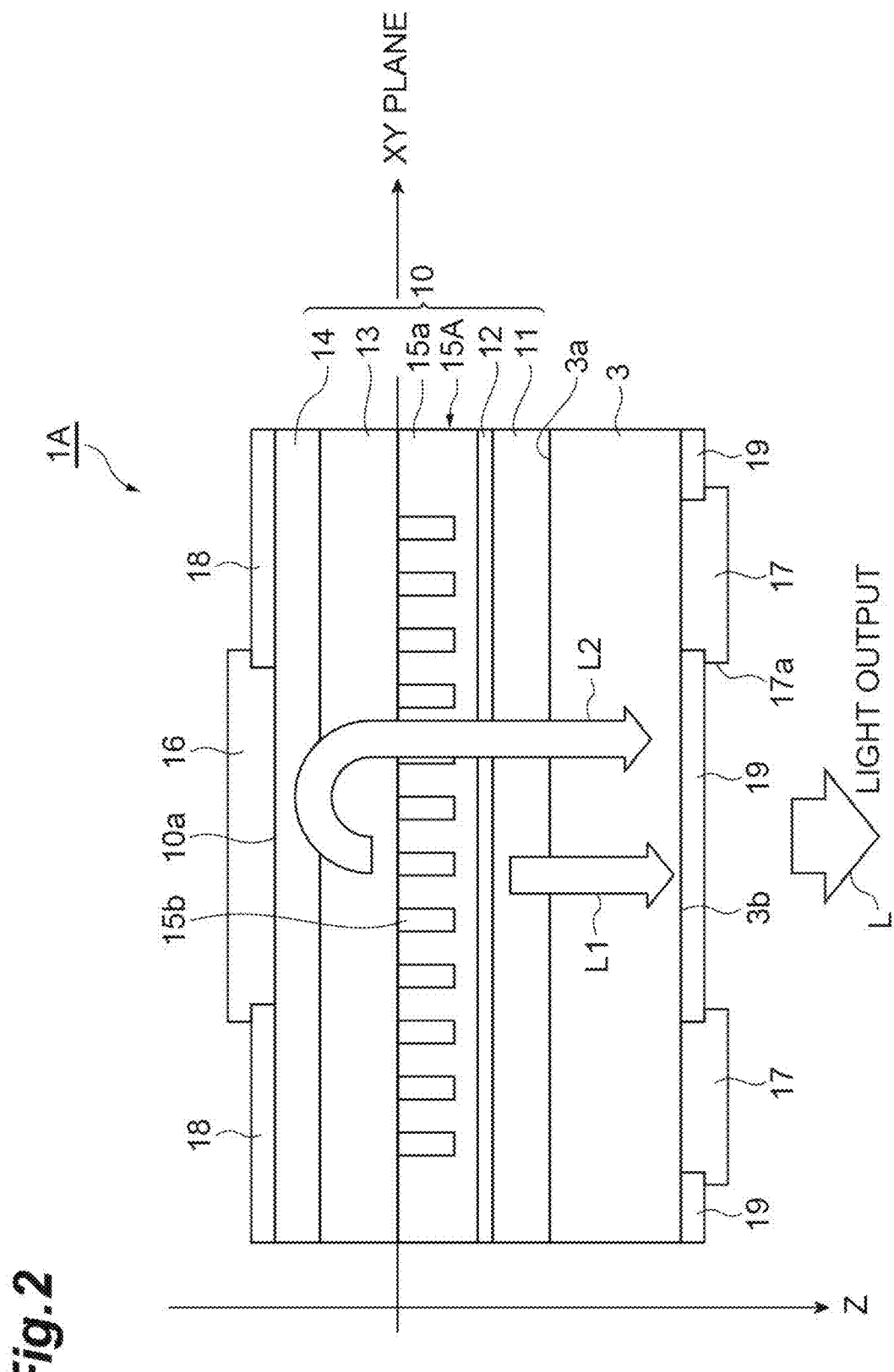
FIG. 2 is a view schematically showing a cross-sectional structure of the surface light-emitting laser element 1A.

FIG. 1 is a perspective view showing a configuration of a surface light-emitting laser element 1A as a light-emitting element according to an embodiment of the present invention. FIG. 2 is a view schematically showing the cross-sectional structure of the surface light-emitting laser element 1A. An XYZ orthogonal coordinate system is defined in which an axis extending along a thickness direction of the surface light-emitting laser element 1A is a Z-axis. The surface light-emitting laser element 1A forms a standing wave in a direction defined on an X-Y plane, and outputs laser light L in a direction (Z-axis direction) perpendicular to a main surface of a semiconductor substrate 3.

The surface light-emitting laser element 1A is a photonic crystal surface emitting laser (PCSEL). The surface light-emitting laser element 1A includes the semiconductor substrate 3 and a semiconductor laminate body 10 provided on a main surface 3a of the semiconductor substrate 3. The semiconductor laminate body 10 is constituted by a cladding layer 11 (first cladding layer) provided on the main surface 3a, an active layer 12 provided on the cladding layer 11, a cladding layer 13 (second cladding layer) provided on the active layer 12, and a contact layer 14 provided on the cladding layer 13. Furthermore, the semiconductor laminate body 10 has a photonic crystal layer 15A. The laser light L is outputted from a rear surface 3b of the semiconductor substrate 3.

Energy bandgaps of the cladding layer 11 and the cladding layer 13 are wider than the energy bandgap of the active layer 12. The thickness directions of the semiconductor substrate 3, the cladding layers 11 and 13, the active layer 12, the contact layer 14, and the photonic crystal layer 15A coincide with the Z-axis direction.

If necessary, the semiconductor laminate body 10 may be provided with a light guide layer for adjusting light distribution at least one of between the cladding layer 11 and the active layer 12 and between the active layer 12 and the cladding layer 13. The light guide layer may include a carrier barrier layer for efficiently confining a carrier in the active layer 12.

Figure 3:
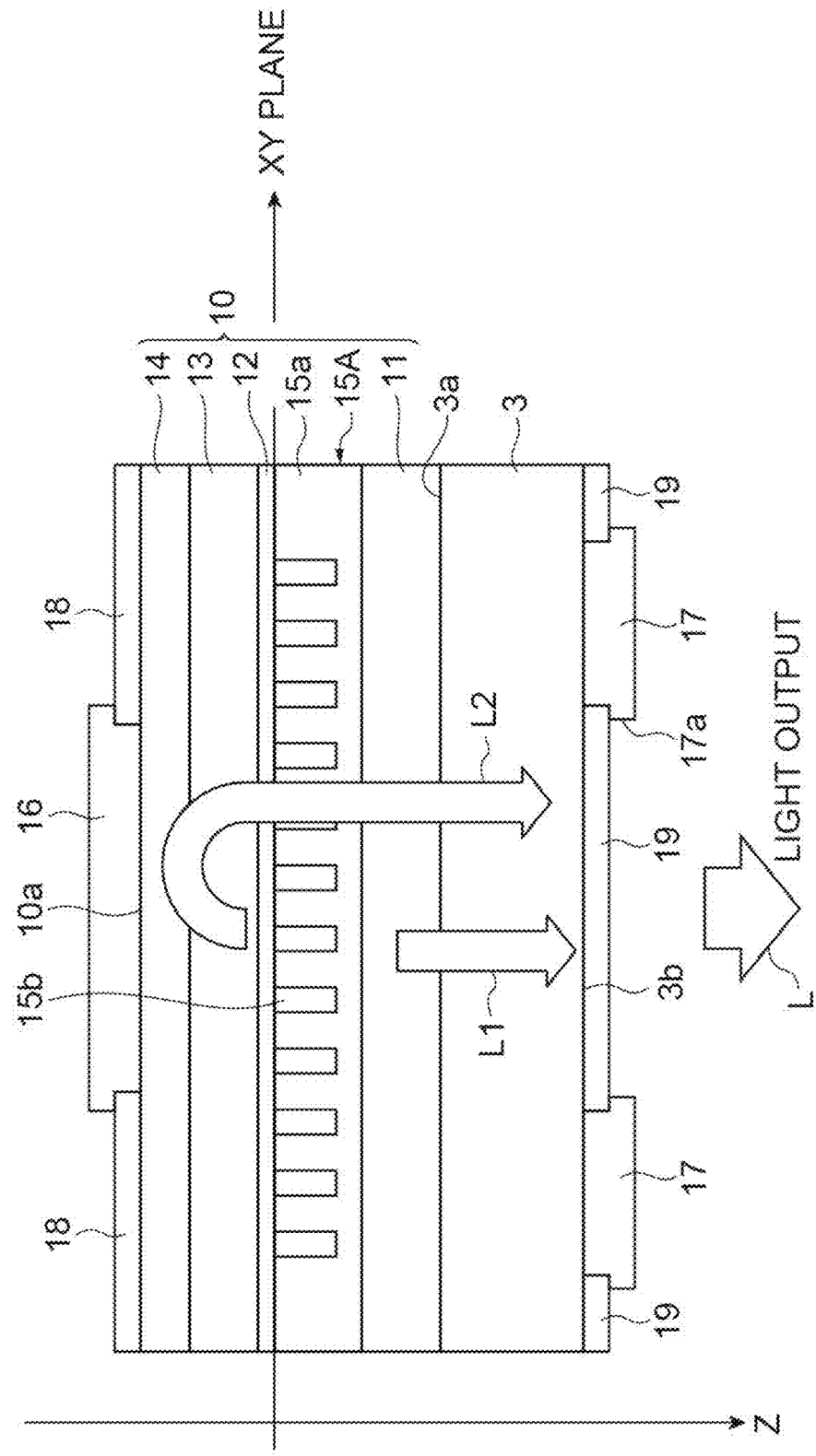
FIG. 3 is a view schematically showing the cross-sectional structure of the surface light-emitting laser element 1A.

In the examples shown in FIGS. 1 and 2, although the photonic crystal layer 15A is provided between the active layer 12 and the cladding layer 13, as shown in FIG. 3, the photonic crystal layer 15A may be provided between the cladding layer 11 and the active layer 12. In addition, when the light guide layer is provided between the active layer 12 and the cladding layer 11, the photonic crystal layer 15A is provided between the cladding layer 11 and the light guide layer.

The photonic crystal layer (diffraction grating layer) 15A is a resonance-mode forming layer in the present embodiment. The photonic crystal layer 15A is constituted by a basic layer 15a and a plurality of modified refractive index regions 15b. The basic layer 15a is a semiconductor layer formed from a first refractive index medium. Each of the plurality of modified refractive index regions 15b includes a second refractive index medium having a refractive index different from that of the first refractive index medium, and exists in the basic layer 15a. The plurality of modified refractive index regions 15b are arranged two-dimensionally and periodically on a design plane (X-Y plane) perpendicular to the thickness direction of the photonic crystal layer 15A. When an equivalent refractive index is n, a wavelength $\lambda_0$ (=a×n, where a is a lattice spacing) selected by the photonic crystal layer 15A is included in an emission wavelength range of the active layer 12. The photonic crystal layer 15A can select the wavelength $\lambda_0$ of emission wavelengths of the active layer 12 and output the wavelength $\lambda_0$ to the outside. In the present embodiment, a natural emission wavelength obtained from the active layer 12 is in a range of 960 nm to 990 nm, an arbitrary wavelength $\lambda_0$ can be selected within a range of a naturally occurring wavelength by adjusting the period and shape of photonic crystal, and the wavelength $\lambda_0$ is, for example, 980 nm.

Figure 4:
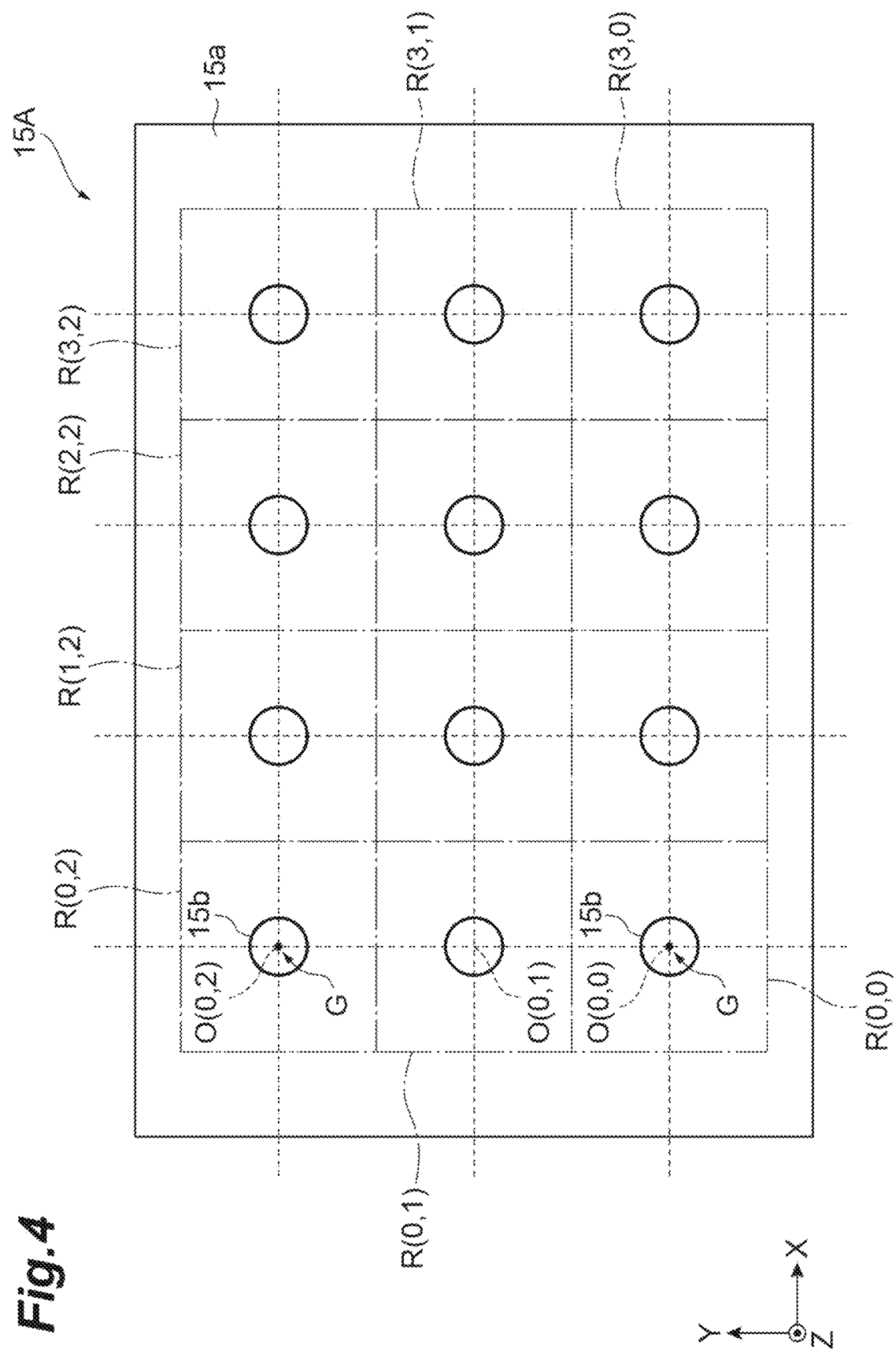
FIG. 4 is a plan view of a photonic crystal layer 15A.

FIG. 4 is a plan view of the photonic crystal layer 15A. Here, a virtual square lattice is set on a plane (set plane) of the photonic crystal layer 15A that coincides with the X-Y plane. One side of this square lattice is parallel to an X-axis, and the other side is parallel to a Y-axis. At this time, a square-shaped unit constituent region R (x, y) centered on a lattice point O (x, y) of the square lattice can be set in two dimensions over a plurality of columns along the X-axis and a plurality of rows along the Y-axis. The x component indicating the coordinates of the unit constituent region R is given by 0, 1, 2, 3, . . . , and indicates a position of an xth lattice point on the X-axis. The y component is given by 0, 1, 2, 3, . . . , and indicates a position of a yth lattice point on the Y-axis. One or more modified refractive index regions 15b are arranged in the unit constituent region R (x, y). That is, one or more modified refractive index regions 15b are associated with the lattice point O (x, y) located at a center of the unit constituent region R (x, y). A planar shape of the modified refractive index region 15b is, for example, a circular shape. Within the unit constituent region R (x, y), a center of gravity G of the modified refractive index region 15b overlaps (coincides) with the lattice point O (x, y). A periodic structure of the plurality of modified refractive index regions 15b is not limited to the example shown in FIG. 4, and for example, a triangular lattice may be set instead of the square lattice.

FIG. 5 is a plan view showing an example in which the modified refractive index region 15b is disposed only in a specific region of the photonic crystal layer 15A. In the example shown in FIG. 5, the periodic structure of the modified refractive index region 15b is formed in a square inner region RIN. On the other hand, the periodic structure of the modified refractive index region 15b is formed also in an outer region ROUT surrounding the inner region RIN. The metal electrode film 16 is formed on the inner region RIN, and a current flows around the inner region RIN. In the case of this structure, light leakage in a direction along a surface including the inner region RIN and the outer region ROUT can be suppressed, and a reduction in threshold current can be expected.

Figure 6E:
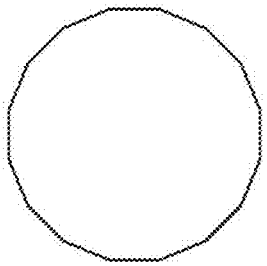
FIGS. 6A to 6G are views showing examples of a planar shape of the modified refractive index region 15b.
Figure 6D:
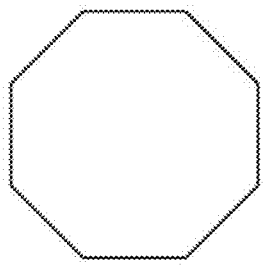
Figure 6G:
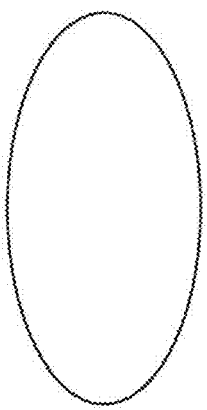
Figure 6C:
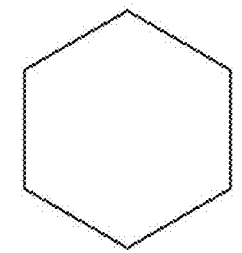
Figure 6B:
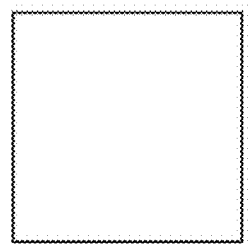
Figure 6F:
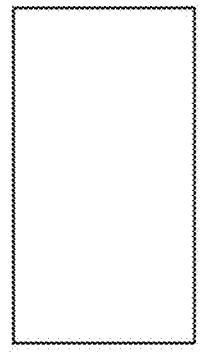
Figure 6A:
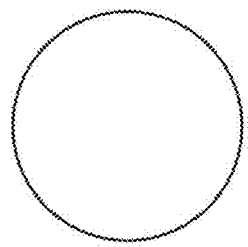

Although FIG. 4 shows an example in which the shape of the modified refractive index region 15b on the X-Y plane is circular, the modified refractive index region 15b may have a shape other than the circular shape. For example, the shape of the modified refractive index region 15b on the X-Y plane may have mirror image symmetry (line symmetry). Here, the mirror image symmetry (line symmetry) refers to the fact that across a certain straight line on the X-Y plane, a planar shape of the modified refractive index region 15b located on one side of the straight line and a planar shape of the modified refractive index region 15b located on the other side of the straight line may be mirror-symmetrical (line-symmetrical) with each other. Examples of the shape having mirror image symmetry (line symmetry) include a perfect circle shown in FIG. 6A, a square shown in FIG. 6B, a regular hexagon shown in FIG. 6C, a regular octagon shown in FIG. 6D, a regular hexadecagon shown in FIG. 6E, a rectangle shown in FIG. 6F, and an ellipse shown in FIG. 6G.

The shape of the modified refractive index region 15b on the X-Y plane may be a shape that does not have rotational symmetry of 180°. Examples of such shapes include an equilateral triangle shown in FIG. 7A, an isosceles right triangle shown in FIG. 7B, a shape shown in FIG. 7C (shape in which parts of two circles or ellipses overlap each other), an oval shape shown in FIG. 7D (shape deformed so that a dimension in a short axis direction near one end along a long axis of an ellipse is smaller than a dimension in the short axis direction near the other end), a teardrop shape shown in FIG. 7E (shape in which one end along a long axis of an ellipse is deformed to a pointed end protruding along a long axis direction), an isosceles triangle shown in FIG. 7F, an arrow shape shown in FIG. 7G (shape in which one side of a rectangle is recessed in a triangular shape and the opposite side is pointed in a triangular shape, a trapezoid shown in FIG. 7H, a pentagon shown in FIG. 7I, a shape shown in FIG. 7J (shape in which parts of two rectangles overlap each other), and a shape shown in FIG. 7K (shape in which parts of two rectangles overlap each other and which does not have mirror image symmetry). As described above, since the shape of the modified refractive index region 15b on the X-Y plane does not have the rotational symmetry of 180°, a higher light output can be obtained.

FIGS. 8A-8K are plan views showing other examples of the shape of the modified refractive index region in the X-Y plane. In this example, a plurality of modified refractive index regions 15c different from the plurality of modified refractive index regions 15b are further provided. Each of the modified refractive index regions 15c includes the second refractive index medium having a refractive index different from that of the first refractive index medium of the basic layer 15a. Similarly to the modified refractive index region 15b, the modified refractive index region 15c may be a hole, or a compound semiconductor may be embedded in the hole. The modified refractive index regions 15c are provided in a one-to-one correspondence with the modified refractive index regions 15b. The center of gravity (composite center of gravity) G of a region constituted by the modified refractive index regions 15b and 15c is located on the lattice point O (x, y) of the unit constituent region R (x, y) constituting a virtual square lattice. Both the modified refractive index regions 15b and 15c are also included in a range of the unit constituent region R (x, y) constituting the virtual square lattice. The unit constituent region R (x, y) is a region surrounded by a straight line that bisects a space between adjacent lattice points of the virtual square lattice.

Although the modified refractive index region 15c has a planar shape, for example, a circular shape, the modified refractive index region 15c may have various shapes, similarly to the modified refractive index region 15b. FIGS. 8A to 8K show examples of the shapes and relative relationships of the modified refractive index regions 15b and 15c on the X-Y plane. FIGS. 8A and 8B show a form in which the modified refractive index regions 15b and 15c have figures of the same shape. FIGS. 8C and 8D show a form in which the modified refractive index regions 15b and 15c have figures of the same shape and parts of the modified refractive index regions 15b and 15c overlap each other. FIG. 8E shows a form in which the modified refractive index regions 15b and 15c have figures of the same shape and the modified refractive index regions 15b and 15c are rotated from each other. FIG. 8F shows a form in which the modified refractive index regions 15b and 15c have figures of different shapes. FIG. 8G shows a form in which the modified refractive index regions 15b and 15c have figures of different shapes and the modified refractive index regions 15b and 15c are rotated from each other.

As shown in FIGS. 8H to 8K, the modified refractive index region 15b may be configured to include two regions 15b1 and 15b2 spaced apart from each other. A distance between the center of gravity (corresponding to the center of gravity of the single modified refractive index region 15b) of a partial region constituted by the regions 15b1 and 15b2 and the center of gravity of the modified refractive index region 15c may be arbitrarily set in the unit constituent region R. In this case, as shown in FIG. 8H, the regions 15b1 and 15b2 and the modified refractive index region 15c may have figures of the same shape as each other. Alternatively, as shown in FIG. 8I, two of the figures of the regions 15b1 and 15b2 and the modified refractive index region 15c may be different from the other figures. As shown in FIG. 8J, in addition to an angle formed by a straight line connecting the regions 15b1 and 15b2 and the X-axis, an angle formed by a straight line connecting the lattice point O and the center of gravity of the modified refractive index region 15c and the X-axis may be arbitrarily set in the unit constituent region R. As shown in FIG. 8K, while the regions 15b1 and 15b2 and the modified refractive index region 15c maintain the same relative angle to each other, the angle formed by the straight line connecting the regions 15b1 and 15b2 and the X-axis may be arbitrarily set in the unit constituent region R.

The plurality of modified refractive index regions 15b may be provided for each of the unit constituent regions R. Here, with respect to the lattice point O in a certain unit constituent region R, among regions surrounded by a perpendicular bisector with the lattice points of the other adjacent unit constituent regions arranged periodically, the unit constituent region R refers to the region with the smallest area and corresponds to a Wigner-Seitz cell in solid-state physics. In that case, the plurality of modified refractive index regions 15b included in one unit constituent region R may have figures of the same shape, and the centers of gravity of the regions may be spaced apart from each other. The shape of the modified refractive index region 15b on the X-Y plane is the same between the unit constituent regions R, and it may be possible to overlap the shapes with each other between the unit constituent regions R by translation operation, or the translation operation and rotation operation. In that case, a fluctuation in a photonic band structure is reduced, and a spectrum with a narrow line width can be obtained. Alternatively, the shape of the modified refractive index region on the X-Y plane does not necessarily have to be the same between the unit constituent regions R, and the shapes may differ from each other between the adjacent unit constituent regions R.

Please refer to FIGS. 1 and 2 again. The surface light-emitting laser element 1A further includes the metal electrode film 16 provided on the contact layer 14 and a metal electrode film 17 provided on the rear surface 3b of the semiconductor substrate 3. The metal electrode film 16 is in ohmic contact with the contact layer 14, and the metal electrode film 17 is in ohmic contact with the semiconductor substrate 3. The metal electrode film 17 has a frame-like (annular) planar shape surrounding an output region of the laser light L, and has an opening 17a. The planar shape of the metal electrode film 17 may be various shapes such as a rectangular frame shape and an annular shape. A portion (including the inside of the opening 17a) of the rear surface 3b of the semiconductor substrate 3 other than the metal electrode film 17 is covered with an antireflection film 19. The antireflection film 19 existing in a region other than the opening 17a may be removed. The metal electrode film 16 is provided in a central region of the contact layer 14, that is, a region that overlaps with the opening 17a when a surface of the contact layer 14 is viewed along the Z-axis direction. A portion on the contact layer 14 other than the metal electrode film 16 is covered with a protective film 18. A portion (non-contact region) of the contact layer 14 that is not in contact with the metal electrode film 16 may be removed.

When a driving current is supplied between the metal electrode film 16 and the metal electrode film 17, electron and hole recombination occurs in the active layer 12 (light emission). The light generated together with the electrons and holes that contribute to this light emission is efficiently distributed between the cladding layer 11 and the cladding layer 13. Light outputted from the active layer 12 is distributed between the cladding layer 11 and the cladding layer 13. Thus, a part of the light outputted from the active layer 12 enters the inside of the photonic crystal layer 15A, and forms the resonance mode in a direction along the main surface 3a of the semiconductor substrate 3 according to a lattice structure inside the photonic crystal layer 15A. Then, light oscillates at a wavelength corresponding to the arrangement period of the plurality of modified refractive index regions 15b (generation of laser light). A part L1 of the laser light outputted from the photonic crystal layer 15A travels in a direction perpendicular to the main surface 3a of the semiconductor substrate 3, directly passes through the opening 17a from the rear surface 3b, and is outputted to the outside of the surface light-emitting laser element 1A. The remaining part L2 of the laser light outputted from the photonic crystal layer 15A is reflected by the metal electrode film 16, then passes through the opening 17a from the rear surface 3b, and is outputted to the outside of the surface light-emitting laser element 1A.

In one example, the semiconductor substrate 3 is a GaAs substrate. The cladding layer 11, the active layer 12, the photonic crystal layer 15A, the cladding layer 13, and the contact layer 14 are formed from a GaAs-based semiconductor. Specifically, the cladding layer 11 is an AlGaAs layer. The active layer 12 has a multiple quantum well structure (barrier layer: AlGaAs/quantum well layer: InGaAs, the number of well layers is, for example, 3). The basic layer 15a of the photonic crystal layer 15A is an AlGaAs layer or a GaAs layer, and the modified refractive index region 15b is a hole The cladding layer 13 is an AlGaAs layer. The contact layer 14 is a GaAs layer. In the case of this example, the thickness of the semiconductor substrate 3 is, for example, 150 µm. The thickness of the cladding layer 11 is, for example, 2000 nm. The thickness of the active layer 12 is, for example, 140 nm. The thickness of the photonic crystal layer 15A is, for example, 300 nm. The thickness of the cladding layer 13 is, for example, 2000 nm. The thickness of the contact layer 14 is, for example, 200 nm. Assuming that the emission wavelength is 980 nm, the refractive index of the cladding layer 11 is, for example, about 3.11. The refractive index of the active layer 12 is, for example, about 3.49. The refractive index of the cladding layer 13 is, for example, about 3.27. The refractive index of the contact layer 14 is, for example, about 3.52.

The cladding layer 11 has the same conductive type as the semiconductor substrate 3. The cladding layer 13 and the contact layer 14 have a conductive type opposite to that of the semiconductor substrate 3. In one example, the semiconductor substrate 3 and the cladding layer 11 are of n-type. The cladding layer 13 and the contact layer 14 are of p-type When the photonic crystal layer 15A is provided between the active layer 12 and the cladding layer 11, the photonic crystal layer 15A has the same conductive type as the semiconductor substrate 3. When the photonic crystal layer 15A is provided between the active layer 12 and the cladding layer 13, the photonic crystal layer 15A has a conductive type opposite to that of the semiconductor substrate 3. An impurity concentration is, for example, $1\times10^{16}$ to $1\times10^{21}/$cm$^3$. In the case of intrinsic (i-type) in which neither impurity is intentionally added, the impurity concentration is $1\times10^{16}$/cm$^3$ or less. The active layer 12 is not limited to being intrinsic (i-type) and may be doped. The impurity concentration of the photonic crystal layer 15A may be intrinsic (i-type), for example, when it is necessary to suppress the influence of loss due to light absorption via an impurity level.

In the above structure, the modified refractive index region 15b is a hole; however, the modified refractive index region 15b may be formed by embedding a semiconductor, having a refractive index different from that of the basic layer 15a, in the hole. In that case, for example, the hole may be formed in the basic layer 15a by etching, and the semiconductor may be embedded in the hole by using an organic metal vapor phase growth method, a molecular beam epitaxy method, a sputtering method, or an epitaxial method. For example, when the basic layer 15a is formed from GaAs, the modified refractive index region 15b may be formed from AlGaAs. After the modified refractive index region 15b is formed by embedding the semiconductor in the hole provided in the basic layer 15a, the same semiconductor as the modified refractive index region 15b may be further deposited on the modified refractive index region 15b. When the modified refractive index region 15b is a hole, the hole may be filled with an inert gas such as argon or nitrogen, or a gas such as hydrogen or air.

The antireflection film 19 is formed from, for example, a dielectric single layer film such as silicon nitride (for example, SiN) or a silicon oxide (for example, SiO$_2$), or a dielectric multilayer film. As the dielectric multilayer film, for example, it is possible to apply a film obtained by stacking two or more types of dielectric layers selected from a dielectric layer group consisting of titanium oxide (TiO$_2$), silicon dioxide (SiO$_2$), silicon monoxide (SiO), niobium oxide (Nb$_2$O$_5$), tantalum pentoxide (Ta$_2$O$_5$), magnesium fluoride (MgF$_2$), titanium oxide (TiO$_2$), aluminum oxide (Al$_2$O$_3$), cerium oxide (CeO$_2$), indium oxide (In$_2$O$_3$), zirconium oxide (ZrO$_2$), and the like. For example, in the case of a single-layer dielectric film, a film having an optical film thickness of 214 with respect to light of a wavelength λ may be stacked. The protective film 18 is an insulating film such as silicon nitride (for example, SiN) or silicon oxide (for example, SiO$_2$).

The material of the metal electrode film 17 is appropriately selected according to a constituent material of the semiconductor substrate 3. When the semiconductor substrate 3 is an n-type GaAs substrate, the metal electrode film 17 may contain, for example, a mixture of Au and Ge. In one example, the metal electrode film 17 has an AuGe single layer or a laminate structure of an AuGe layer and an Au layer. However, the material of the metal electrode film 17 is not limited to this as long as ohmic contact can be realized.

Figure 9:
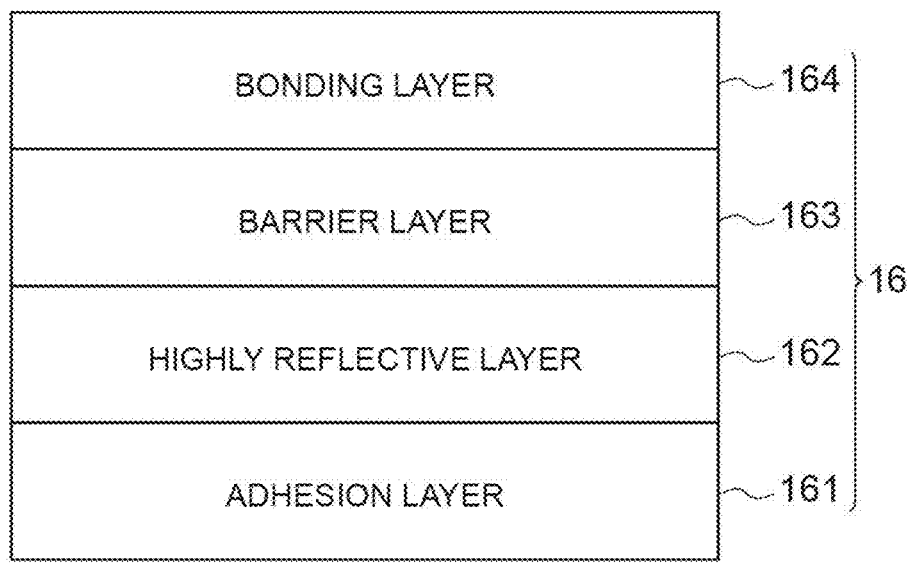
FIG. 9 is a view schematically showing a layer structure of a metal electrode film 16.

Here, the structure of the metal electrode film 16 will be described in detail. FIG. 9 is a view schematically showing a layer structure of the metal electrode film 16. As shown in FIG. 9, the metal electrode film 16 is configured to include an adhesion layer 161 (first layer), a highly reflective layer 162 (second layer), a barrier layer 163 (third layer), and a bonding layer 164 (fourth layer). These layers 161 to 164 are stacked in a thickness direction (that is, the Z-axis direction) of the semiconductor substrate 3.

The adhesion layer 161 is a layer that is in ohmic contact with the semiconductor laminate body 10 by being adhered to a surface 10a (the surface of the contact layer 14 in the present embodiment) of the semiconductor laminate body 10. The adhesion layer 161 is formed from a material having good adhesion to a semiconductor or the protective film 18, for example, a material containing at least one element of Ti, Cr, Mo, and Ni. As a result, ohmic contact between the p-type contact layer 14 and the adhesion layer 161 can be suitably realized. In one example, the adhesion layer 161 is a Ti layer, a Cr layer, a Mo layer, a Ni layer, or a Ti alloy layer (for example, a TiW layer or a TiMo layer). The thickness of the adhesion layer 161 is, for example, 1 nm or more, and for example, 50 nm or less. When the thickness of the adhesion layer 161 is 1 nm or more, good ohmic contact with the semiconductor laminate body 10 can be realized. When the thickness of the adhesion layer 161 is 50 nm or less, deterioration of light reflection characteristics of the metal electrode film 16 due to the adhesion layer 161 can be effectively suppressed.

The highly reflective layer 162 is a layer that reflects the laser light L from the photonic crystal layer 15A toward the rear surface 3b of the semiconductor substrate 3. The highly reflective layer 162 has a composition different from that of the adhesion layer 161 and is provided on the adhesion layer 161 (in one example, the highly reflective layer 162 is in contact with the adhesion layer 161). The fact that two layers have different compositions refers to that some elements included as the composition in one of the two layers are not included as the composition in the other layer. Even if a certain element is not included as the composition, the element may be included due to mutual diffusion from an adjacent layer, or the like. The highly reflective layer 162 is formed from a material having a high reflectance (reflectance higher than that of at least the barrier layer 163) at the wavelength of the laser light outputted from the photonic crystal layer 15A, for example, a material mainly containing at least one element of Au, Ag, Al, and Cu. As a result, the light reflectance of the highly reflective layer 162 can be increased. In one example, the highly reflective layer 162 is an Au layer, an Ag layer, an Al layer, or a Cu layer. The thickness of the highly reflective layer 162 is, for example, 10 nm or more, and for example, 1000 nm or less. When the thickness of the highly reflective layer 162 is 10 nm or more, the laser light L from the photonic crystal layer 15A can be suitably reflected. When the thickness of the highly reflective layer 162 is 1000 nm or less, both good light reflection characteristics and shortening of deposition time can be achieved at the same time.

Figure 10:
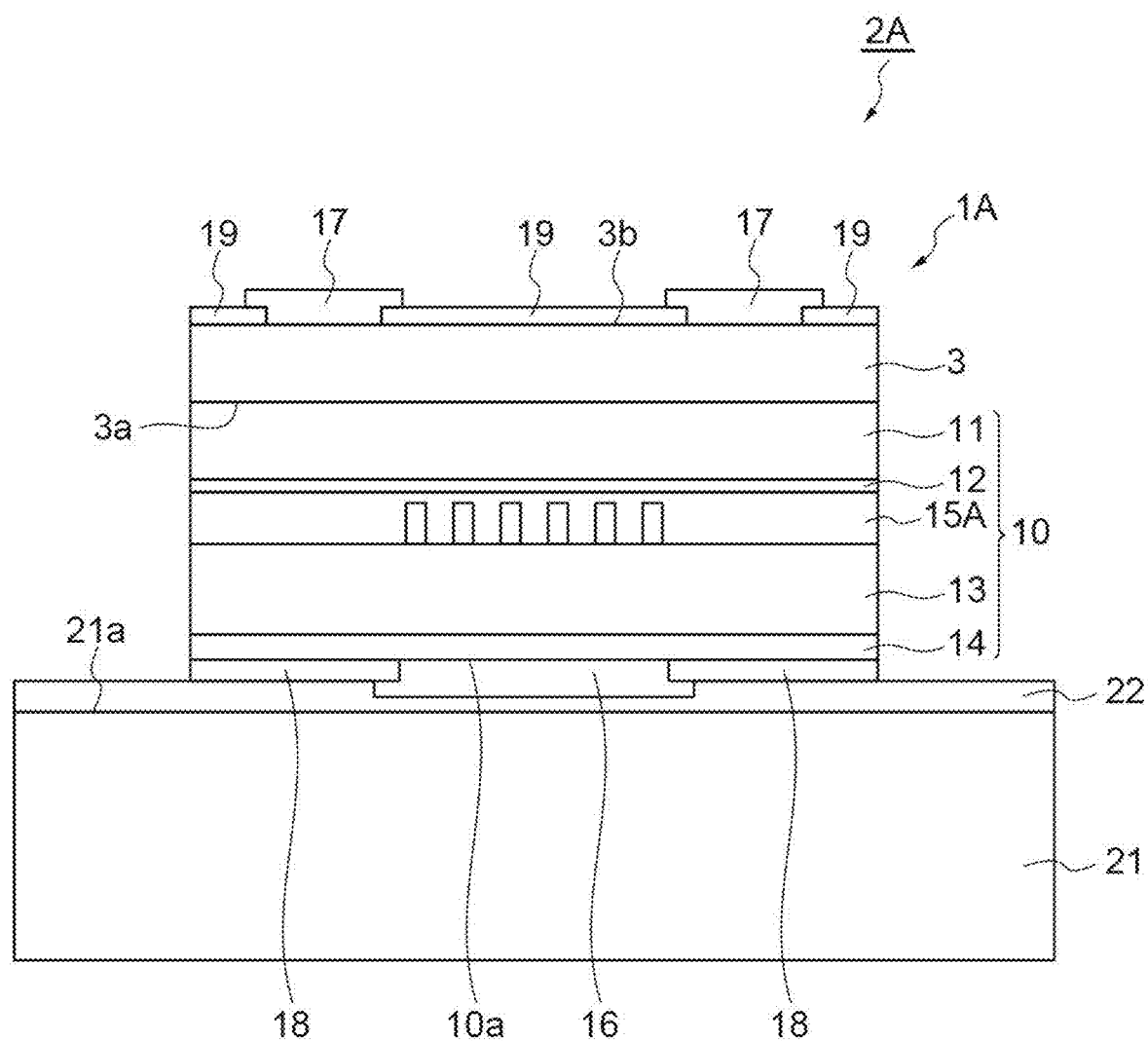
FIG. 10 is a view schematically showing a cross-sectional structure of a light-emitting device 2A as an example of mounting the surface light-emitting laser element 1A.

The bonding layer 164 is a layer that is bonded to solder when the surface light-emitting laser element 1A is mounted. Here, FIG. 10 is a view schematically showing a cross-sectional structure of a light-emitting device 2A as an example of mounting the surface light-emitting laser element 1A. The light-emitting device 2A includes a conductive submount 21 in addition to the surface light-emitting laser element 1A. The submount 21 has, for example, a rectangular parallelepiped appearance, and functions as a heat sink that supplies a current to the surface light-emitting laser element 1A and releases heat generated in the surface light-emitting laser element 1A. In one example, the submount 21 is formed from SiC. The submount 21 has a flat mounting surface 21*a* on which the surface light-emitting laser element 1A is mounted. The surface light-emitting laser element 1A is disposed on the mounting surface 21*a* so that the main surface 3*a* of the semiconductor substrate 3 faces the mounting surface 21*a*. The metal electrode film 16 and the mounting surface 21*a* are conductively bonded to each other with a solder layer 22 interposed therebetween. At this time, the solder layer 22 is in contact with the bonding layer 164 of the metal electrode film 16. The solder layer 22 may be in contact with the protective film 18. In one example, the solder layer 22 includes Sn solder formed from an Sn single material, In solder formed from In single material, eutectic solder containing Sn (for example, AuSn-based solder or PbSn-based solder), or lead-free solder containing Sn (for example, SnAgCu-based solder, SnCu-based solder, SnZnBi-based solder, SnAgInBi-based solder, or SnZnAl-based solder).

When the light-emitting device 2A is manufactured, the solder material for the solder layer 22 is deposited on the mounting surface 21*a* of the submount 21 or on the surface light-emitting laser element 1A (on the metal electrode film 16 and the protective film 18) by using a vapor deposition method or the like. The solder material is once melted and then cooled by raising the temperature of the mounting surface 21*a* in a state where the surface light-emitting laser element 1A is disposed on the mounting surface 21*a*. As a result, the mounting surface 21*a*, and the metal electrode film 16 and the protective film 18 are bonded to each other with the solder layer 22 interposed therebetween.

The bonding layer 164 has the same or different composition as the highly reflective layer 162, and is provided on the highly reflective layer 162. The bonding layer 164 is formed from a material that is hard to oxidize and has high wettability to the solder material, for example, a material mainly containing at least one element of Au, Ag, Pt, Cu, Pd, Ni, and Al. Consequently, sufficient contact with the solder material is made, and electrical and physical contact with a constituent material of the submount 21 is obtained. In one example, the bonding layer 164 is an Au layer, an Ag layer, a Pt layer, a Cu layer, a Pd layer, a Ni layer, or an Al layer, and is formed from a material different from the barrier layer 163. The thickness of the bonding layer 164 is, for example, 10 nm or more, and for example, 1000 nm or less. Since the thickness of the bonding layer 164 is 10 nm or more, the solder layer 22 and the bonding layer 164 sufficiently react (are co-crystallized), and good bonding strength can be obtained. Since the thickness of the bonding layer 164 is 1000 nm or less, both good bonding strength and shortening of deposition time can be achieved at the same time.

The barrier layer 163 has a composition different from the compositions of the highly reflective layer 162 and the bonding layer 164, and is provided between the highly reflective layer 162 and the bonding layer 164. In one example, the barrier layer 163 is in contact with the highly reflective layer 162 and the bonding layer 164. The barrier layer 163 is formed from a material in which a diffusion degree of the solder material (particularly any of the above-mentioned solder materials) is lower than the diffusion degrees in the highly reflective layer 162 and the bonding layer 164. As a result, the solder material that gradually diffuses toward the highly reflective layer 162 while reacting with a constituent material of the bonding layer 164 is blocked in the barrier layer 163 (diffusion of the solder material to the highly reflective layer 162 is suppressed). The barrier layer 163 mainly contains at least one element of, for example, Pt, Ni, Ta, W, and Cr, or contains TiN. As a result, the diffusion of the solder material can be effectively blocked. In one example, the barrier layer 163 is a Pt layer, a Ni layer, a Ta layer, a W layer, a TiN layer or a Cr layer.

The barrier layer 163 may be thicker than the adhesion layer 161 and may be thinner than the highly reflective layer 162 and the bonding layer 164. A material constituting the barrier layer 163 may take longer to form a film than the materials constituting the highly reflective layer 162 and the bonding layer 164. When the thickness of the barrier layer 163 has increased up to a certain value or higher, the solder material is almost blocked, and a diffusion suppressing effect is hardly increased. Therefore, the barrier layer 163 can be made thinner than the highly reflective layer 162 and the bonding layer 164, and thus a time required for forming the metal electrode film 16 can be shortened. Since the thickness of the adhesion layer 161 is sufficient as long as ohmic contact is made, the adhesion layer 161 may be thinner than the barrier layer 163. In one example, the thickness of the barrier layer 163 is 1 nm or more, more preferably 100 nm or more. The thickness of the barrier layer 163 is 1000 nm or less, more preferably 200 nm or less. When the thickness of the barrier layer 163 is 1 nm or more, the diffusion of the solder material can be effectively suppressed. Since the thickness of the barrier layer 163 is 1000 nm or less, both the effect of sufficiently suppressing solder diffusion and shortening of deposition time can be achieved at the same time.

Figure 11:
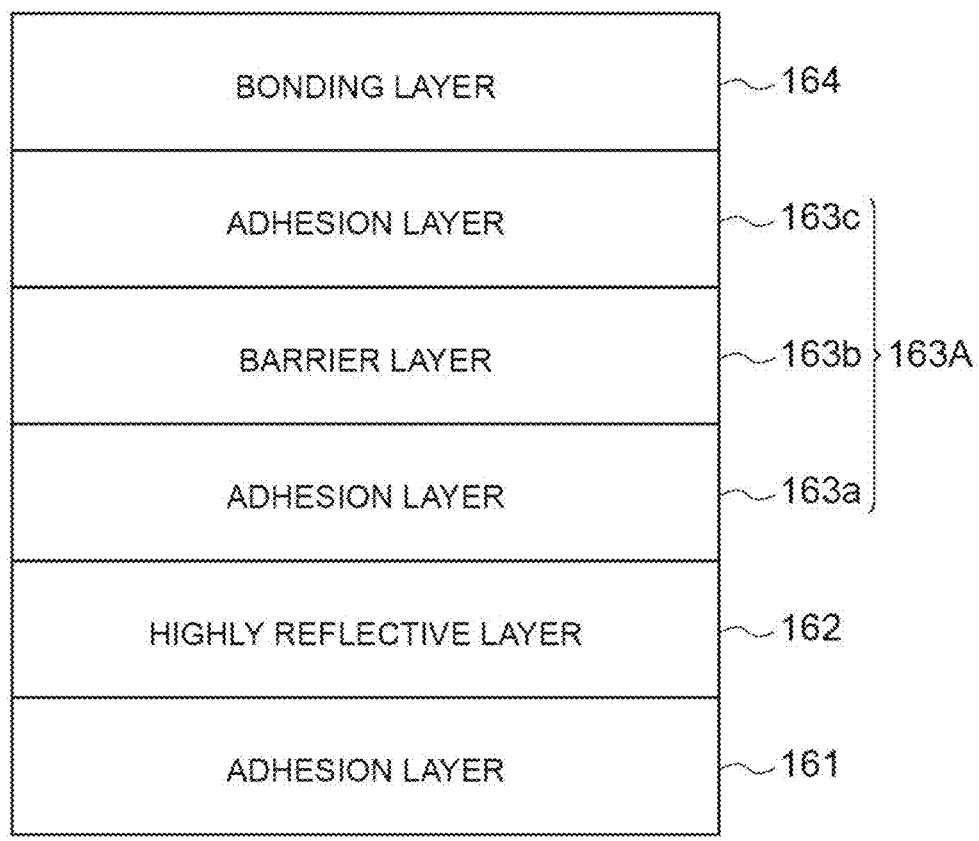
FIG. 11 is a view schematically showing a modification of a barrier layer.

FIG. 11 is a view schematically showing a modification of a barrier layer. In this example, a barrier layer 163A has a laminate structure including a plurality of layers 163*a*, 163*b* and 163*c*. The layer 163*b* is a layer that mainly blocks the diffusion of the solder material. The layer 163*a* is a layer provided to bring the layer 163*b* into close contact with the highly reflective layer 162 and prevent the layers from peeling off from each other. The layer 163*c* is a layer provided to bring the bonding layer 164 into close contact with the layer 163b and prevent the layers from peeling off from each other. The layers 163a and 163c can be formed of the above-mentioned constituent material of the adhesion layer 161, and the layer 163b can be formed of a material of the above-mentioned constituent materials of the barrier layer 163, which is different from the layers 163a and 163c. If necessary, either one of the layers 163a and 163c may be omitted.

In an example actually produced by the inventors, the adhesion layer 161 is a Ti layer having a thickness of 2 nm. The highly reflective layer 162 is an Au layer having a thickness of 200 nm. The barrier layer 163 is a Pt layer having a thickness of 150 nm. The bonding layer 164 is an Au layer having a thickness of 200 nm. In another example actually produced by the inventors, the adhesion layer 161 is a Cr layer having a thickness of 2 nm. The highly reflective layer 162 is an Au layer having a thickness of 500 nm. The layer 163a of the barrier layer 163A is a Ti layer having a thickness of 50 nm, the layer 163b is a Pt layer having a thickness of 100 nm, and the layer 163c is not provided. The bonding layer 164 is an Au layer having a thickness of 200 nm.

When the metal electrode film 16 is formed, first, the adhesion layer 161, the highly reflective layer 162, the barrier layer 163, and the bonding layer 164 are deposited on the contact layer 14 in this order. As the deposition method, for example, a physical deposition method such as a vapor deposition method or a sputtering method can be applied. Next, in order to realize ohmic contact with the contact layer 14, the metal electrode film 16 is annealed. At this time, the mutual diffusion between the constituent material of the contact layer 14 and the constituent material of the adhesion layer 161 and the mutual diffusion of the constituent materials of the layers 161 to 164 occur. Therefore, a boundary between the contact layer 14 and the adhesion layer 161 and each boundary of the layers 161 to 164 may be ambiguous.

Figure 12A:
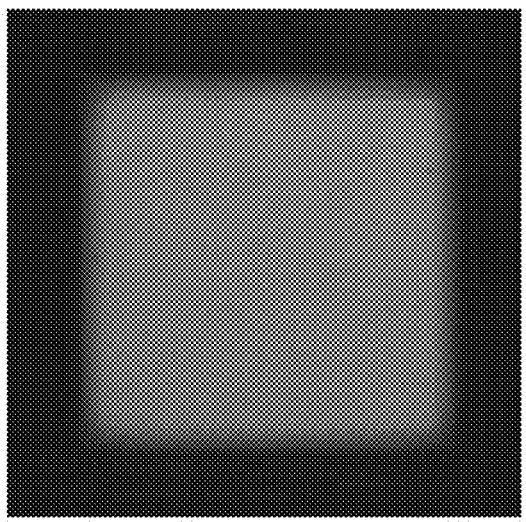
FIGS. 12A to 12C are photographs showing a result when a long-term energization test is performed on a surface light-emitting laser element of a comparative example and a chronological change of a light reflection state in a metal electrode film is observed from a light emitting surface (rear surface of a substrate) side.
Figure 12B:
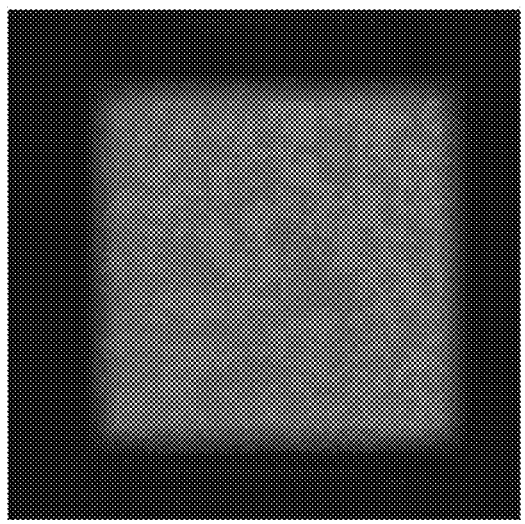
Figure 12C:
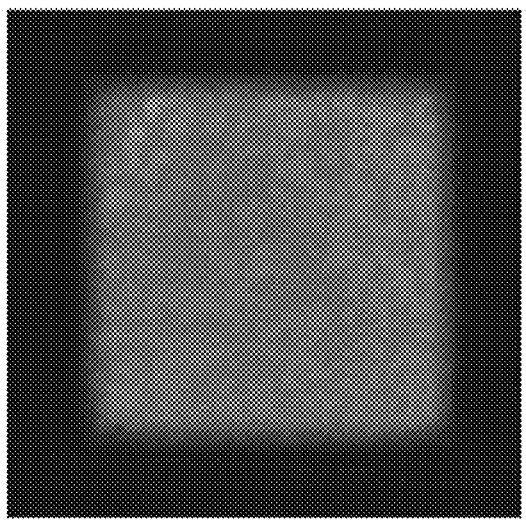

The effect obtained by the surface light-emitting laser element 1A of the present embodiment having the above configuration will be described. Thus, a conventional metal electrode film has a laminate structure of a lower layer (when a contact target is a p-type GaAs semiconductor, for example, a Ti layer, a Cr layer, or an Ni layer) for ohmic contact and an upper layer (for example, an Au layer) in contact with solder. The inventors have experimentally found that when a surface light-emitting laser element provided with a metal electrode film having such a structure is operated, the light output decreases with time. In order to find out the cause, the inventors performed a long-term energization test on the surface light-emitting laser element and observed a chronological change of a light reflection state in the metal electrode film from a light emitting surface (rear surface of a substrate) side. FIGS. 12A to 12C are photographs showing the results. FIG. 12A shows the light reflection state at the time of spontaneous emission before the start of the test. FIG. 12B shows the light reflection state at the time of spontaneous emission 150 hours after the start of the test. FIG. 12C shows the light reflection state at the time of spontaneous emission 1000 hours after the start of the test. With reference to FIGS. 12A to 12C, it can be seen that although reflected light intensity is uniform before the start of the test, the reflected light intensity becomes non-uniform 150 hours after the start of the test, and a macular dark portion occurs. That is, the inventors have found that a chronological decrease in light output is mainly due to chronological deterioration of the light reflection state in the metal electrode film, that is, chronological deterioration of morphology of the metal electrode film.

The inventors considered the cause of such deterioration as follows. That is, when the surface light-emitting laser element operates, the temperature of the element rises due to its heat generation. As the temperature rises, the constituent material of the solder gradually diffuses toward the lower layer while reacting with a constituent material of the upper layer. FIG. 13A is a view schematically showing a state in which a lower layer 31 comprised of Cr and an upper layer 32 comprised of Au are stacked on the semiconductor laminate body 10 and the submount 21 and the upper layer 32 are bonded with the solder layer 22 interposed therebetween. FIG. 13B is an enlarged view of an interface between the upper layer 32 and the solder layer 22. As shown in FIG. 13B, when a constituent material of the solder layer 22 diffuses toward the lower layer 31 while reacting with a constituent material of the upper layer 32, the constituent material of the solder layer 22 and the constituent material of the upper layer 32 react (are co-crystallized) with each other to form a eutectic region 33 in the upper layer 32. At this time, the constituent material of the solder layer 22 diffuses non-uniformly inside the upper layer 32. Thus, the eutectic region 33 grows non-uniformly in the upper layer 32, and the surface of the upper layer 32 becomes uneven. It is considered that such a change in the surface shape of the upper layer 32 causes a decrease in light reflectance and light scattering. Due to such a phenomenon, the light output of the surface light-emitting laser element is reduced. Thus, in the surface light-emitting laser element provided with the metal electrode film having the structure shown in FIG. 13A, a chronological decrease in light output due to operation is unavoidable.

On the other hand, in the present embodiment, the metal electrode film 16 includes the adhesion layer 161 (first layer), the highly reflective layer 162 (second layer), the barrier layer 163 (third layer), and the bonding layer 164 (fourth layer). The adhesion layer 161 is in ohmic contact with the semiconductor laminate body 10 by being adhered to the semiconductor laminate body 10 (for example, the contact layer 14). The highly reflective layer 162 is provided on the adhesion layer 161, has a composition different from that of the adhesion layer 161, and reflects light from the photonic crystal layer 15A. The bonding layer 164 is provided on the highly reflective layer 162, and is bonded to the solder layer 22 at the time of mounting. The barrier layer 163 is provided between the highly reflective layer 162 and the bonding layer 164, and has a composition different from the compositions of the highly reflective layer 162 and the bonding layer 164. The diffusion degree of the solder material in the barrier layer 163 is lower than that those of the highly reflective layer 162 and the bonding layer 164. In this case, as the temperature of the surface light-emitting laser element 1A rises, the constituent material of the solder layer 22 gradually diffuses toward the highly reflective layer 162 while reacting with the constituent material of the bonding layer 164. However, the barrier layer 163 in which the diffusion degree of the solder material is low exists between the highly reflective layer 162 and the bonding layer 164. Therefore, the solder material is blocked in the barrier layer 163 and is difficult to diffuse into the highly reflective layer 162. Thus, the highly reflective layer 162 is less likely to be affected by the diffusion of the solder material and suppresses the decrease in light reflectance. In addition, the highly reflective layer 162 can reduce light scattering due to unevenness. From the above, according to the surface light-emitting laser element 1A of the present embodiment, it is possible to suppress the chronological decrease in light output due to operation.

Figure 14:
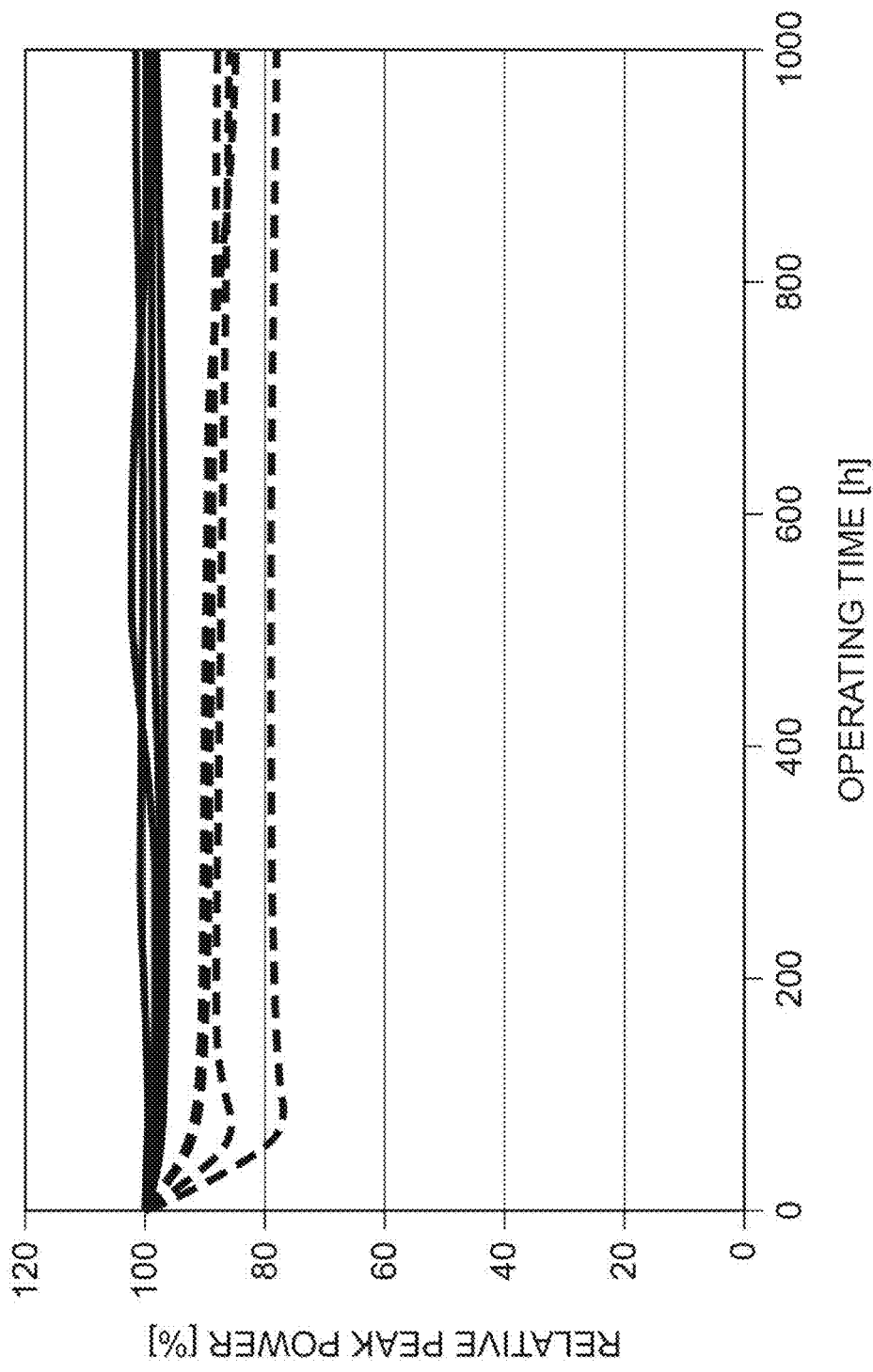
FIG. 14 is a graph showing a result of verifying an effect of one embodiment.

FIG. 14 is a graph showing a result of verifying the above-mentioned effect of the present embodiment. In FIG. 14, the horizontal axis shows operating time (unit: hour), and the vertical axis shows a relative peak power (unit: %) of the laser light outputted from the surface light-emitting laser element. A solid line in FIG. 14 shows results in the plurality of surface light-emitting laser elements 1A according to the present embodiment, and a broken line shows results in the plurality of surface light-emitting laser elements having a metal reflective film of FIG. 13A as a comparative example. In this experiment, an operating temperature of the surface light-emitting laser element is 85° C. A pulse width tw is 50 nanoseconds. A frequency fr is 25 kHz. A peak current value Top is 25 amps. In the surface light-emitting laser element 1A, the adhesion layer 161 is a Cr layer having a thickness of 5 nm. The highly reflective layer 162 is an Au layer having a thickness of 500 nm. The barrier layer 163 has a laminate structure of a Ti layer having a thickness of 50 nm and a Pt layer having a thickness of 100 nm. The bonding layer 164 is an Au layer having a thickness of 200 nm. The thickness of the lower layer 31 (Cr layer) in Comparative Example is 5 nm. The thickness of the upper layer 32 (Au layer) is 500 nm. Sn solder was applied as the solder layer 22.

With reference to FIG. 14, in the comparative example, it can be seen that the relative peak power gradually decreases with the passage of time from immediately after the start of the operation until about 100 hours have passed. After about 100 hours have passed, the relative peak power is reduced by about 15 to 20%, and this relative peak power is maintained thereafter. On the other hand, it can be seen that the surface light-emitting laser element 1A of the present embodiment maintains a high relative peak power from immediately after the start of operation.

Figure 15A:
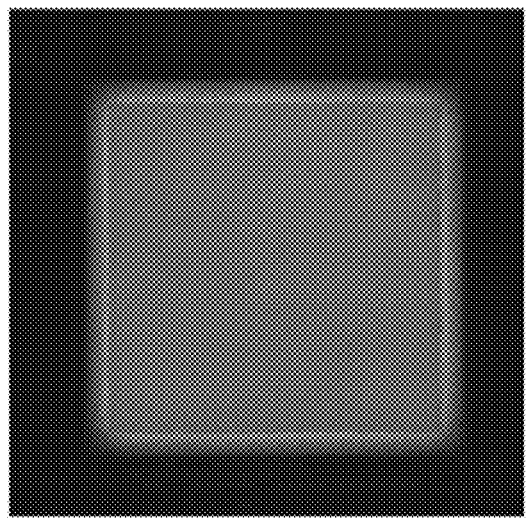
FIGS. 15A to 15C are photographs showing a result when a long-term energization test is performed on the surface light-emitting laser element 1A of an embodiment and a chronological change of the light reflection state in the metal electrode film 16 is observed from a light emitting surface (rear surface 3b of a semiconductor substrate 3) side.
Figure 15B:
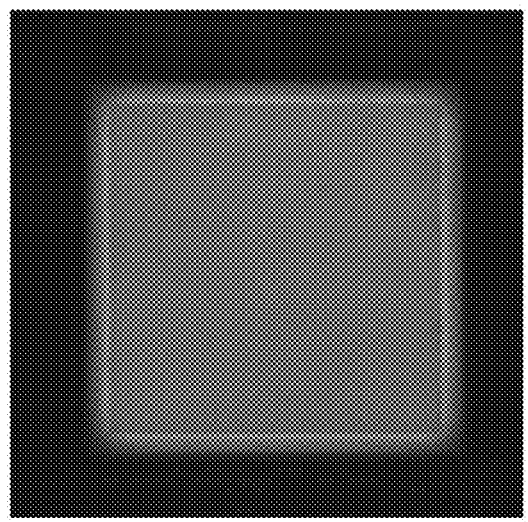
Figure 15C:
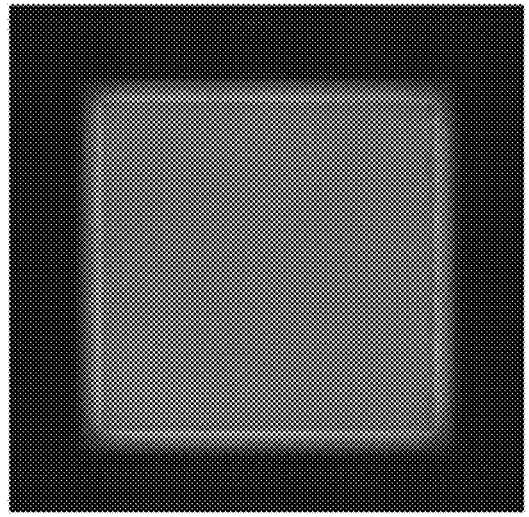

FIGS. 15A to 15C are photographs showing a result when a long-term energization test is performed on the surface light-emitting laser element 1A of the present embodiment and a chronological change of the light reflection state in the metal electrode film 16 is observed from the light emitting surface (the rear surface 3b of the semiconductor substrate 3) side. FIG. 15A shows the light reflection state at the time of spontaneous emission before the start of the test. FIG. 15B shows the light reflection state at the time of spontaneous emission 150 hours after the start of the test. FIG. 15C shows the light reflection state at the time of spontaneous emission 1000 hours after the start of the test. With reference to FIGS. 15A to 15C, the light reflection state hardly changes between before the start of the test and after 1000 hours have passed. That is, in the surface light-emitting laser element 1A, a chronological change of the light reflection state hardly occurs.

As described above, according to the surface light-emitting laser element 1A of the present embodiment, it is possible to suppress the chronological decrease in light output due to operation. Therefore, the present embodiment makes it possible to provide the surface light-emitting laser element 1A with high reliability. The present embodiment can contribute to increasing the output of the surface light-emitting laser element 1A, which is advantageous in a driving environment where heat is likely to be generated, such as a high duty operation during pulse driving.

In a metal electrode film of a conventional surface light-emitting laser element, a Pt layer may be provided between a Ti layer and an Au layer. In this case, the metal electrode film has a layered structure such as Ti/Pt/Au. When this metal electrode film is used as a light reflection film, the solder material hardly diffuses into the Pt layer, so that the light reflection state of the Pt layer hardly changes with time. However, the light reflectance of the Pt layer is much lower than that of the Au layer. Therefore, light output efficiency of the surface light-emitting laser element becomes low from an initial stage of energization. On the other hand, according to the surface light-emitting laser element 1A of the present embodiment, while it is possible to obtain high light output efficiency from the initial stage of energization, the high light output efficiency can be maintained for a long time.

As in the present embodiment, the surface light-emitting laser element 1A may include, as the resonance-mode forming layer, the photonic crystal layer 15A in which the plurality of modified refractive index regions 15b are periodically arranged. In this case, the part L2 of the laser light generated in the photonic crystal layer 15A is diffracted in the direction perpendicular to the main surface 3a of the semiconductor substrate 3 and reflected by the metal electrode film 16. After that, the reflected laser light L2 reaches the rear surface 3b of the semiconductor substrate 3 and is outputted from the rear surface 3b to the outside of the surface light-emitting laser element 1A. Therefore, the above-mentioned effect of the metal electrode film 16 of the present embodiment can be preferably obtained.

(First Modification)

In the above-described embodiment, the surface light-emitting laser element 1A which is a PCSEL has been described. However, the light-emitting element of the present invention is not limited to the PCSEL and can be various surface light-emitting laser elements. For example, a surface light-emitting laser element that outputs an arbitrary optical image by controlling the phase spectrum and intensity spectrum of light outputted from a plurality of light emitting points arranged two-dimensionally has been studied. Such a surface light-emitting laser element is called an S-iPM (Static-integrable Phase Modulating) laser, and outputs light for forming a two-dimensional arbitrary-shaped optical image along both a normal direction of the main surface of the semiconductor substrate (direction perpendicular to the main surface of the semiconductor substrate) and an inclination direction intersecting the normal direction.

FIG. 16 is a plan view of a phase modulation layer 15B included in an S-iPM laser. The surface light-emitting laser element 1A of the above embodiment may include the phase modulation layer 15B shown in FIG. 16 instead of the photonic crystal layer 15A (see FIG. 4). As a result, the surface light-emitting laser element can be an S-iPM laser. The phase modulation layer 15B is a resonance-mode forming layer in the present modification. In the surface light-emitting laser element of the present modification, the other configurations except the phase modulation layer 15B are the same as those of the above embodiment, and therefore, detailed description thereof will be omitted.

The phase modulation layer 15B includes the basic layer 15a formed from the first refractive index medium and the modified refractive index region 15b formed from the second refractive index medium having a refractive index different from that of the first refractive index medium. Here, a virtual square lattice is set on a plane of the phase modulation layer 15B that coincides with the X-Y plane. It is assumed that one side of the square lattice is parallel to the X-axis, and the other side is parallel to the Y-axis. At this time, the square-shaped unit constituent region R (x, y) centered on the lattice point O (x, y) of the square lattice can be set in two dimensions over the plurality of columns along the X-axis and the plurality of rows along the Y-axis. The x component indicating the coordinates of the unit constituent region R is given by 0, 1, 2, 3, . . . , and indicates a position of an xth lattice point on the X-axis. The y component is given by 0, 1, 2, 3, . . . , and indicates a position of a yth lattice point on the Y-axis. In the unit constituent region R (x, y), one modified refractive index region 15b is associated with the lattice point O (x, y) located at the center. That is, one modified refractive index region 15b is disposed in each of the unit constituent regions R. A planar shape of the modified refractive index region 15b is, for example, a circular shape. Within the unit constituent region R (x, y), the center of gravity G of the modified refractive index region 15b is disposed away from the associated lattice point O (x, y) (closest lattice point).

Figure 17:
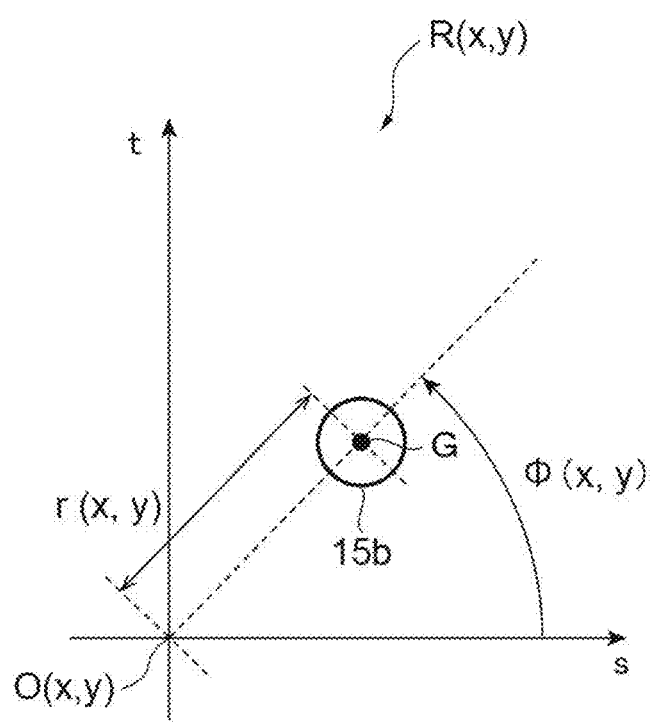
FIG. 17 is an enlarged view of a portion of the phase modulation layer 15B.

FIG. 17 shows arrangement in the unit constituent region R (x, y), and the position in the unit constituent region R (x, y) is given by an orthogonal coordinate system defined by an s-axis parallel to the X-axis and a t-axis parallel to the Y-axis. An angle formed by a vector connecting the lattice point O (x, y) located at the center of the unit constituent region R (x, y) and the center of gravity G and the s-axis is φ (x, y). The x component indicating the coordinates of the unit constituent region R indicates the position of the xth lattice point on the X-axis as described above. Similarly, the y component indicates the position of the yth lattice point on the Y-axis. When the rotation angle φ (x, y) is 0°, the direction of the vector connecting the lattice point O (x, y) and the center of gravity G coincides with a positive direction of the s-axis. A length of the vector connecting the lattice point O (x, y) and the center of gravity G is r (x, y). In one example, r (x, y) is fixed at a predetermined value regardless of the x component and the y component (over the entire phase modulation layer 15B).

As shown in FIG. 16, in the phase modulation layer 15B, the rotation angle φ around the lattice point O of the center of gravity G of the modified refractive index region 15b is individually set independent for each unit constituent region according to a desired optical image. Although the rotation angle φ (x, y) has a specific value for each position determined by the values of the x component and the y component, the rotation angle φ (x, y) is not always represented by a specific function. That is, the rotation angle φ (x, y) is determined from an extracted phase distribution of complex amplitude distributions obtained by inverse Fourier transforming a desired optical image. When the complex amplitude distribution is obtained from a desired optical image, by applying an iterative algorithm such as the Gerchberg-Saxton (GS) method generally used at the time of calculation of hologram generation, reproducibility of a beam pattern is improved.

In the present modification, the laser light outputted from the active layer 12 enters the inside of the phase modulation layer 15B while being confined between the cladding layer 11 and the cladding layer 13. Then, the laser light entering the phase modulation layer 15B forms a predetermined mode corresponding to the lattice structure inside the phase modulation layer 15B. The laser light scattered in the phase modulation layer 15B and emitted to the outside of the phase modulation layer 15B is outputted to the outside from the rear surface 3b of the semiconductor substrate 3. At this time, the 0th-order light is outputted along a normal direction of the main surface 3a (the direction perpendicular to the main surface 3a). On the other hand, a +1st-order light and a −1st-order light are outputted along both the normal direction of the main surface 3a and the inclination direction intersecting the normal direction (outputted in a two-dimensional arbitrary direction).

Figure 18:
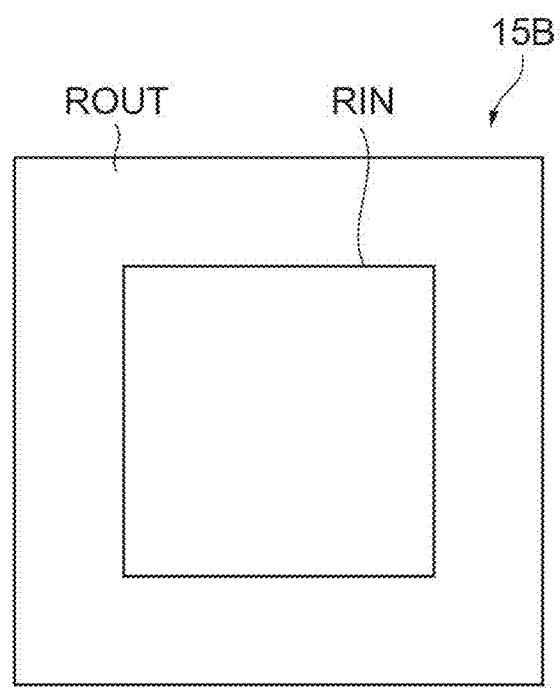
FIG. 18 is a plan view showing an example in which a refractive index structure of FIG. 16 is applied only within a specific region of the phase modulation layer.

FIG. 18 is a plan view showing an example in which the refractive index structure of FIG. 16 is applied only within a specific region of the phase modulation layer. In the example shown in FIG. 18, a refractive index structure (example: the structure of FIG. 16) for outputting a target beam pattern is formed in the square inner region RIN. On the other hand, in the outer region ROUT surrounding the inner region RIN, a true circular modified refractive index region whose center of gravity coincides with a position of the lattice point of the square lattice is disposed. Both inside the inner region RIN and inside the outer region ROUT, a lattice spacing of a virtual square lattice is the same (=a). In the case of this structure, since the light is distributed also in the outer region ROUT, it is possible to suppress occurrence of high frequency noise (so-called window function noise) caused by abrupt change in light intensity in the peripheral part of the inner region RIN. In addition, light leakage in the direction along the surface including the inner region RIN and the outer region ROUT can be suppressed, and a reduction in threshold current can be expected.

As in the present modification, the surface light-emitting laser element may include the phase modulation layer 15B as a resonance-mode forming layer. In this case, a part of the laser light generated in the phase modulation layer 15B (including a part of the +1st-order light and the −1st-order light, and further including the 0th-order light) is diffracted in the normal direction of the main surface 3a of the semiconductor substrate 3 and reflected by the metal electrode film 16. After that, the reflected laser light reaches the rear surface 3b of the semiconductor substrate 3 and is outputted from the rear surface 3b to the outside of the surface light-emitting laser element. Therefore, the above-mentioned effect of the metal electrode film 16 of the present embodiment can be preferably obtained.

(Second Modification)

Figure 19:
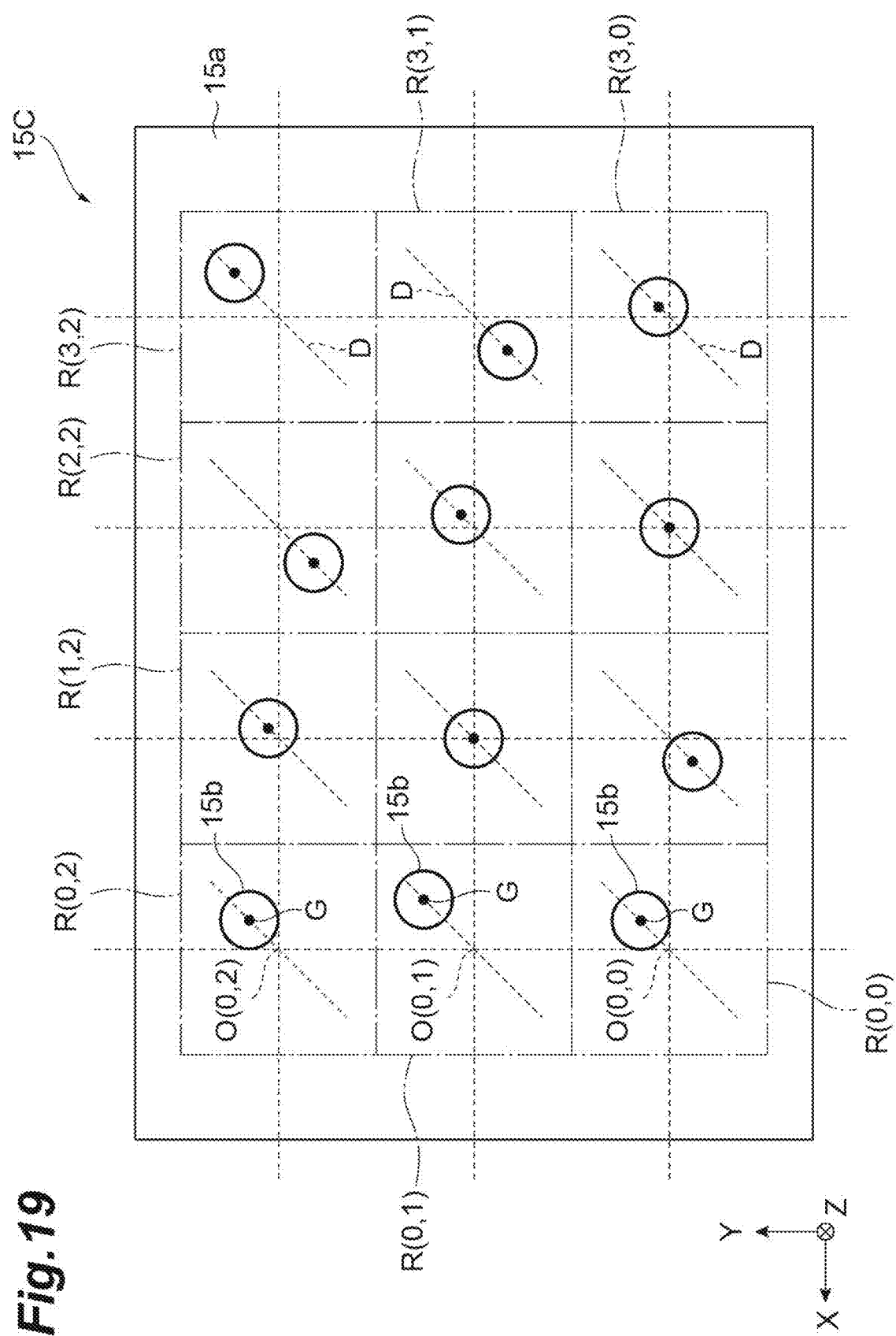
FIG. 19 is a plan view of a phase modulation layer 15C included in the S-iPM laser.
Figure 20:
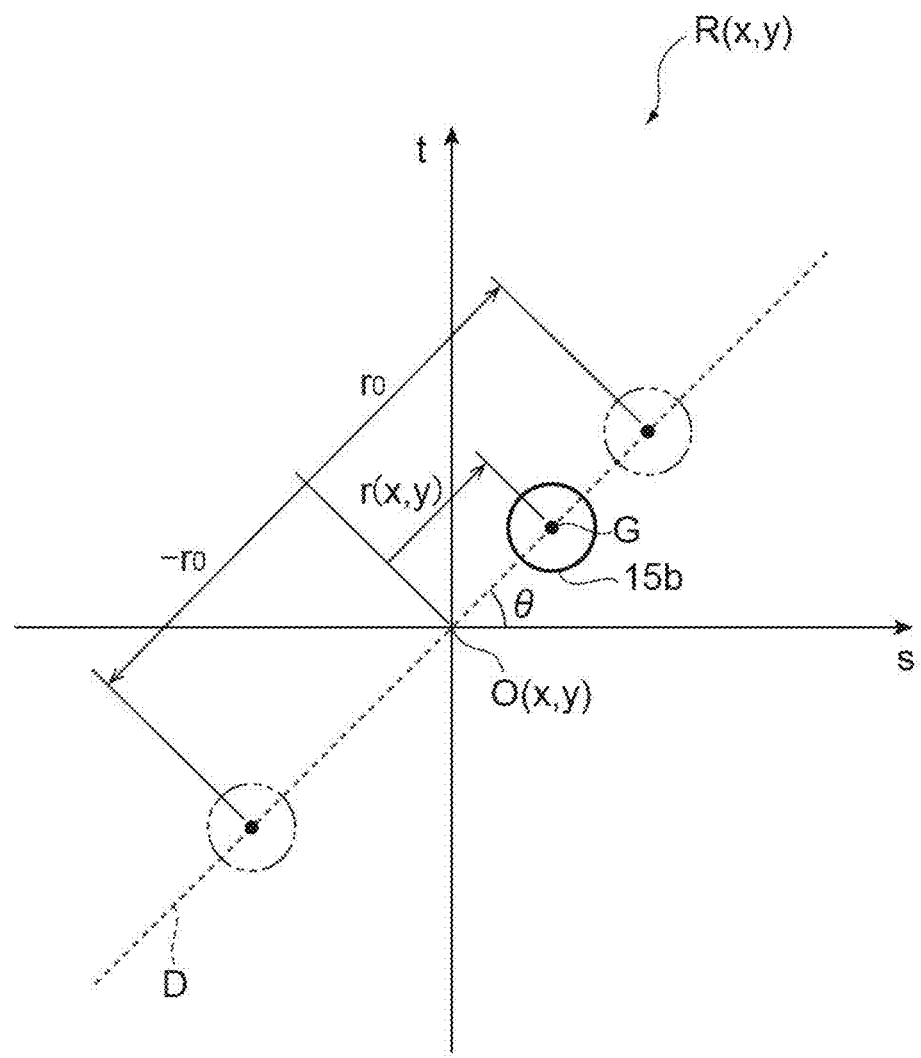
FIG. 20 is a view showing a positional relationship of the modified refractive index region 15b in the phase modulation layer 15C.

The S-iPM laser is not limited to the configuration of the first modification described above. For example, even with the configuration of the phase modulation layer of the present modification, the S-iPM laser can be preferably realized. FIG. 19 is a plan view of a phase modulation layer 15C included in the S-iPM laser. FIG. 20 is a view showing a positional relationship of the modified refractive index region 15b in the phase modulation layer 15C. The phase modulation layer 15C is a resonance-mode forming layer in the present modification. As shown in FIGS. 19 and 20, in the phase modulation layer 15C, the center of gravity G of each of the modified refractive index regions 15b is disposed on a straight line D. The straight line D is a straight line that passes through the lattice point O (x, y) located at the center of the unit constituent region R (x, y) and is inclined with respect to each side of the square lattice. In other words, the straight line D is a straight line that is inclined with respect to both the X-axis and the Y-axis. An inclination angle of the straight line D with respect to one side (X-axis) of the square lattice is —θ. The inclination angle θ is fixed at a predetermined value in all unit constituent regions in the phase modulation layer 15C. The inclination angle θ satisfies 0°<θ<90°, and in one example, θ=45°. Alternatively, the inclination angle θ satisfies 180°<θ<270°, and in one example, θ=225°. Thus, when the inclination angle θ satisfies 0°<θ<90° or 180°<θ<270°, the straight line D extends from a first quadrant to a third quadrant of a coordinate plane defined by the X-axis and the Y-axis. On the other hand, the inclination angle θ may satisfy 90°<θ<180°, and in one example, θ may be 135°. Alternatively, the inclination angle θ may satisfy 270°<θ<360°, and in one example, θ may be 315°. Thus, when the inclination angle θ satisfies 90°<θ<180° or 270°<θ<360°, the straight line D extends from a second quadrant to a fourth quadrant of the coordinate plane defined by the X-axis and the Y-axis. That is, the inclination angle θ is an angle excluding 0°, 90°, 180°, and 270°. By setting the inclination angle θ in this way, both a light wave traveling in the X-axis direction and a light wave traveling in the Y-axis direction can be contributed in a light output beam. Here, a distance between the lattice point O (x, y) and the center of gravity G in the unit constituent region R (x, y) is set to r (x, y). The x component indicating the coordinates of the unit constituent region R indicates the position of the xth lattice point on the X-axis, and the y component indicates the position of the yth lattice point on the Y-axis. When the distance r (x, y) is a positive value, the center of gravity G is located in the first quadrant (or the second quadrant). When the distance r (x, y) is a negative value, the center of gravity G is located in the third quadrant (or the fourth quadrant). When the distance r (x, y) is 0, the lattice point O (x, y) and the center of gravity G coincide with each other.

In the unit constituent region R (x, y) shown in FIG. 19, the distance r (x, y) between the center of gravity G of the modified refractive index region 15b and the lattice point O (x, y) located at the center of the unit constituent region R (x, y) is individually set for each of the modified refractive index regions 15b associated with each lattice point constituting the square lattice according to a desired optical image. Although a distribution of the distance r (x, y) has a specific value for each unit constituent region determined by the values of the x component and the y component, the distribution of the distance r (x, y) is not always represented by a specific function. The distribution of the distance r (x, y) is determined by extracting the phase distribution of the complex amplitude distribution obtained by inverse Fourier transforming a desired optical image. That is, when a phase P (x, y) in the unit constituent region (x, y) shown in FIG. 20 is $P_0$, the distance r (x, y) is set to 0. If the phase P (x, y) is $\pi+P_0$, the distance r (x, y) is set to a maximum value $r_0$. If the phase P (x, y) is $-\pi+P_0$, the distance r (x, y) is set to a minimum value $-r_0$. For the intermediate phase P (x, y), the distance r (x, y) is set such that r (x, y)={P (x, y)−$P_0$}× $r_0/\pi$ Here, an initial phase $P_0$ can be set arbitrarily. Assuming that the lattice spacing of the square lattice is a, the maximum value $r_0$ of r (x, y) is, for example, within a range of:

$$0 \le r_0 \le \frac{a}{\sqrt{2}}.$$

In the present modification as well, the refractive index structure of FIG. 19 may be applied only within a specific region of the phase modulation layer. For example, as in the example shown in FIG. 18, a refractive index structure (example: the structure of FIG. 19) for outputting a target beam pattern may be formed in the square inner region RIN. In this case, in the outer region ROUT surrounding the inner region RIN, a true circular modified refractive index region whose center of gravity coincides with the position of the lattice point of the square lattice is disposed. Both inside the inner region RIN and inside the outer region ROUT, a lattice spacing of a virtual square lattice is the same (=a). In the case of this structure, since the light is distributed also in the outer region ROUT, it is possible to suppress occurrence of high frequency noise (so-called window function noise) caused by abrupt change in light intensity in the peripheral part of the inner region RIN. In addition, light leakage in the direction along the surface including the inner region RIN and the outer region ROUT can be suppressed, and a reduction in threshold current can be expected.

As in the present modification, the surface light-emitting laser element may include the phase modulation layer 15C as a resonance-mode forming layer. In this case, a part of the laser light generated in the phase modulation layer 15C (including a part of the +1st-order light and the −1st-order light, and further including 0th-order light) is diffracted in the normal direction of the main surface 3a of the semiconductor substrate 3 and reflected by the metal electrode film 16. After that, the reflected laser light reaches the rear surface 3b of the semiconductor substrate 3 and is outputted from the rear surface 3b to the outside of the surface light-emitting laser element. Therefore, the above-mentioned effect of the metal electrode film 16 of the above-described embodiment can be preferably obtained.

(Third Modification)

FIG. 21 is a view showing a configuration of a light-emitting device 2B according to a third modification. The light-emitting device 2B includes a support substrate 73, the plurality of surface light-emitting laser elements 1A arranged one-dimensionally or two-dimensionally on the support substrate 73, and a drive circuit 72 that individually drives the plurality of surface light-emitting laser elements 1A. The configuration of each of the surface light-emitting laser elements 1A is the same as that of the above embodiment. Each of the surface light-emitting laser elements 1A is disposed in a direction in which the main surface 3a of the semiconductor substrate 3 and the support substrate 73 face each other, and the metal electrode film 16 and the support substrate 73 of each of the surface light-emitting laser elements 1A are conductively bonded via a solder layer. The drive circuit 72 is provided on a rear surface or inside of the support substrate 73, and individually drives each of the surface light-emitting laser elements 1A. The drive circuit 72 supplies a drive current to each of the surface light-emitting laser elements 1A according to an instruction from a control circuit 71.

In the present modification, the surface light-emitting laser element of each modification may be applied instead of the surface light-emitting laser element 1A. In that case, the same effect can be obtained.

The light-emitting element and the light-emitting device according to the present invention are not limited to the above-described embodiment, and various other modifications are possible. For example, in the above-described embodiment and each modification, the form (rear-face output type) in which the laser light is outputted from the rear surface 3b of the semiconductor substrate 3 is exemplified. However, the present invention can also be applied to a surface light-emitting laser element that outputs the laser light from the surface 10a of the semiconductor laminate body 10 (the surface of the contact layer 14 or the surface of the cladding layer 13 exposed by removing a portion of the contact layer 14). In that case, the metal electrode film provided on the rear surface 3b of the semiconductor substrate 3 has the same configuration as the metal electrode film 16 of the above embodiment. However, the adhesion layer (first layer) is in ohmic contact with the semiconductor substrate 3 by being adhered to the rear surface 3b of the semiconductor substrate 3. In the above-described embodiment, the metal electrode film that forms ohmic contact with the p-type semiconductor has the barrier layer. However, the metal electrode film that forms ohmic contact with the n-type semiconductor may have the barrier layer. Furthermore, in the above-described embodiment, the semiconductor substrate which is a growth substrate is used as the substrate. However, the substrate is not limited to the semiconductor substrate which is a growth substrate as long as it can mechanically support the semiconductor laminate body.

REFERENCE SIGNS LIST

1A ... Surface light-emitting laser element; 2A, 2B ... Light-emitting device; 3 ... Semiconductor substrate; 3a ... Main surface; 3b ... Rear surface; 10 ... Semiconductor laminate body; 11 Cladding layer; 12 ... Active layer; 13 ... Cladding layer; 14 ... Contact layer; 15A ... Photonic crystal layer; 15B, 15C ... Phase modulation layer; 15a ... Basic layer; 15b, 15c ... Modified refractive index region; 16, 17 ... Metal electrode film; 17a ... Opening; 18 ... Protective film; 19 ... Antireflection film; 21 ... Submount; 21a ... Mounting surface; 22 ... Solder layer; 31 ... Lower layer; 32 ... Upper layer; 33 ... Eutectic region; 71 ... Control circuit; 72 ... Drive circuit; 73 ... Support substrate; 161 ... Adhesion layer; 162 ... Highly reflective layer; 163, 163A ... Barrier layer; 164 ... Bonding layer; D ... Straight line; G ... Center of gravity; L ... Laser light; O ... Lattice point; R ... Unit constituent region; RIN ... Inner region; and ROUT ... Outer region.

The invention claimed is:

1. A light-emitting element comprising:
a substrate having a main surface and a rear surface opposing the main surface; and
a semiconductor laminate body provided on the main surface of the substrate and having a lower surface facing the main surface and an upper surface located on an opposite end side of the substrate with respect to the lower surface, the semiconductor laminate body including a first cladding layer provided between the lower surface and the upper surface, a second cladding layer provided between the first cladding layer and the upper surface, an active layer provided between the first cladding layer and the second cladding layer, and a resonance-mode forming layer provided between the first cladding layer and the second cladding layer,
wherein the resonance-mode forming layer includes a basic layer and a plurality of modified refractive index regions configured to each have a refractive index different from that of the basic layer and be distributed in a two-dimensional manner on a set plane perpendicular to a stacking direction of the semiconductor laminate body,
a structure body constituted by the substrate and the semiconductor laminate body has a first structural surface corresponding to the rear surface of the substrate and a second structural surface corresponding to the upper surface of the semiconductor laminate body, while a region for outputting laser light is provided on one of the first structural surface and the second structural surface of the structure body, on the other surface of the first structural surface and the second structural surface, a metal electrode film having a first layer surface facing the structure body and a second layer surface located on an opposite side to the structure body with respect to the first layer surface is provided,
the metal electrode film includes a first layer configured to have the first layer surface and be in close contact with the structure body via the first layer surface so as to form ohmic contact with the structure body,
a second layer configured to be provided between the first layer and the second layer surface, have a composition different from that of the first layer, and reflect light from the resonance-mode forming layer,
a third layer configured to be provided between the second layer and the second layer surface, have a composition different from that of the second layer, and have a lower diffusion degree than the second layer with respect to a diffusion degree of a solder material, and
a fourth layer for solder bonding configured to be provided between the third layer and the second layer surface, have a composition different from that of the third layer, and have a higher diffusion degree than the third layer with respect to the diffusion degree of the solder material.

2. The light-emitting element according to claim 1, wherein the second layer mainly contains at least one element of Au, Ag, Al, and Cu.

3. The light-emitting element according to claim 1, wherein the third layer mainly contains at least one element of Pt, Ni, Ta, W, and Cr, or contains TiN.

4. The light-emitting element according to claim 1, wherein the fourth layer mainly contains at least one element of Au, Ag, Pt, Cu, Pd, Ni, and Al, and is formed of a material different from the third layer.

5. The light-emitting element according to claim 1, wherein the first layer contains at least one element of Ti, Cr, Mo, and Ni.

6. The light-emitting element according to claim 1, wherein a thickness of the third layer defined along a direction from the first layer surface toward the second layer surface is thicker than a thickness of the first layer and thinner than a thickness of each of the second layer and the fourth layer.

7. The light-emitting element according to claim 1, wherein a thickness of the first layer defined along a direction from the first layer surface toward the second layer surface is 50 nm or less, and a thickness of each of the second layer, the third layer, and the fourth layer is 1000 nm or less.

8. The light-emitting element according to claim 1, wherein the resonance-mode forming layer is a photonic crystal layer in which the plurality of modified refractive index regions are periodically arranged along at least one direction on the set plane.

9. The light-emitting element according to claim 1, wherein on the set plane, each of the plurality of modified refractive index regions is associated with any one of a plurality of lattice points of a virtual square lattice defined on the set plane,
for each lattice point of the virtual square lattice, a center of gravity of the modified refractive index region associated with the lattice point is disposed at a position away from the lattice point, and for each lattice point of the virtual square lattice, a rotation angle of a line segment connecting the lattice point and the center of gravity of the associated modified refractive index region with respect to the virtual square lattice is set.

10. The light-emitting element according to claim 1, wherein on the set plane, each of the plurality of modified refractive index regions is associated with any one of a plurality of lattice points of a virtual square lattice defined on the set plane, for each lattice point of the virtual square lattice, a center of gravity of the modified refractive index region associated with the lattice point is disposed on a straight line configured to pass through the lattice point and be inclined with respect to the virtual square lattice, and for each lattice point of the virtual square lattice, a distance from the lattice point to the associated modified refractive index region is set.

11. A light-emitting device comprising:
the light-emitting element according to claim 1; and
a submount having a mounting surface on which the light-emitting element is mounted,
wherein the metal electrode film of the light-emitting element and the mounting surface are bonded to each other via solder, and
the solder is Sn solder, In solder, eutectic solder containing Sn, or lead-free solder containing Sn.

12. A light-emitting element comprising:
a substrate having a main surface and a rear surface opposing the main surface; and
a semiconductor laminate body provided on the main surface of the substrate and having a lower surface facing the main surface and an upper surface located on an opposite end side of the substrate with respect to the lower surface, the semiconductor laminate body including a first cladding layer provided between the lower surface and the upper surface, a second cladding layer provided between the first cladding layer and the upper surface, an active layer provided between the first cladding layer and the second cladding layer, and a resonance-mode forming layer provided between the first cladding layer and the second cladding layer,
wherein the resonance-mode forming layer includes a basic layer and a plurality of modified refractive index regions configured to each have a refractive index different from that of the basic layer and be distributed in a two-dimensional manner on a set plane perpendicular to a stacking direction of the semiconductor laminate body,
a structure body constituted by the substrate and the semiconductor laminate body has a first structural surface corresponding to the rear surface of the substrate and a second structural surface corresponding to the upper surface of the semiconductor laminate body,
while a region for outputting laser light is provided on one of the first structural surface and the second structural surface of the structure body, on the other surface of the first structural surface and the second structural surface, a metal electrode film having a first layer surface facing the structure body and a second layer surface located on an opposite side to the structure body with respect to the first layer surface is provided,
the metal electrode film includes a first layer configured to have the first layer surface and be in close contact with the structure body via the first layer surface so as to form ohmic contact with the structure body,
a second layer configured to be provided between the first layer and the second layer surface, has a composition different from that of the first layer, and reflects light from the resonance-mode forming layer, the second layer mainly containing at least one element of Au, Ag, Al, and Cu,
a third layer configured to be provided between the second layer and the second layer surface, have a composition different from that of the second layer, and have a lower diffusion degree than the second layer with respect to a diffusion degree of a solder material, the third layer mainly containing at least one element of Pt, Ni, Ta, W, and Cr or containing TiN, and
a fourth layer for solder bonding configured to be provided between the third layer and the second layer surface, have a composition different from that of the third layer, and have a higher diffusion degree than the third layer with respect to the diffusion degree of the solder material, the fourth layer mainly containing at least one element of Au, Ag, Pt, Cu, Pd, Ni, and Al.

13. The light-emitting element according to claim 12, wherein the first layer contains at least one element of Ti, Cr, Mo, and Ni.

14. The light-emitting element according to claim 12, wherein a thickness of the third layer defined along a direction from the first layer surface toward the second layer surface is thicker than a thickness of the first layer and thinner than a thickness of each of the second layer and the fourth layer.

15. The light-emitting element according to claim 12, wherein a thickness of the first layer defined along a direction from the first layer surface toward the second layer surface is 50 nm or less, and a thickness of each of the second layer, the third layer, and the fourth layer is 1000 nm or less.

16. The light-emitting element according to claim 12, wherein the resonance-mode forming layer is a photonic crystal layer in which the plurality of modified refractive index regions are periodically arranged along at least one direction on the set plane.

17. The light-emitting element according to claim 12, wherein on the set plane, each of the plurality of modified refractive index regions is associated with any one of a plurality of lattice points of a virtual square lattice defined on the set plane,
for each lattice point of the virtual square gird, a center of gravity of the modified refractive index region associated with the lattice point is disposed at a position away from the gird point, and for each lattice point of the virtual square gird, a rotation angle of a line segment connecting the lattice point and the center of gravity of the associated modified refractive index region with respect to the virtual square gird is set.

18. The light-emitting element according to claim 12, wherein on the set plane, each of the plurality of modified refractive index regions is associated with any one of a plurality of lattice points of a virtual square lattice defined on the set plane,
for each lattice point of the virtual square gird, a center of gravity of the modified refractive index region associated with the lattice point is disposed on a straight line configured to pass through the lattice point and be inclined with respect to the virtual square lattice, and for each lattice point of the virtual square gird, a distance from the lattice point to the associated modified refractive index region is set.

19. A light-emitting device comprising:
the light-emitting element according to claim 12; and
a submount having a mounting surface on which the light-emitting element is mounted,
wherein the metal electrode film of the light-emitting element and the mounting surface are bonded to each other via solder, and
the solder is Sn solder, In solder, eutectic solder containing Sn, or lead-free solder containing Sn.

* * * * *